(12) United States Patent
Kando

(10) Patent No.: US 7,737,603 B2
(45) Date of Patent: Jun. 15, 2010

(54) BOUNDARY ACOUSTIC WAVE DEVICE

(75) Inventor: Hajime Kando, Ritto (JP)

(73) Assignee: Murata Manufacturiing Co., Ltd., Kyoto (JP)

( * ) Notice: Subject to any disclaimer, the term of this patent is extended or adjusted under 35 U.S.C. 154(b) by 105 days.

(21) Appl. No.: 10/596,359

(22) PCT Filed: Dec. 2, 2004

(86) PCT No.: PCT/JP2004/017929

§ 371 (c)(1),
(2), (4) Date: Jun. 9, 2006

(87) PCT Pub. No.: WO2005/060094

PCT Pub. Date: Jun. 30, 2005

(65) Prior Publication Data
US 2007/0090898 A1    Apr. 26, 2007

(30) Foreign Application Priority Data
Dec. 16, 2003  (JP)  ............... 2003-418526

(51) Int. Cl.
*H01L 41/047*  (2006.01)
*H01L 41/18*  (2006.01)
(52) U.S. Cl. ............... 310/313 R; 310/313 A; 310/313 B
(58) Field of Classification Search ........... 310/313 R, 310/313 A, 313 B, 313 C, 313 D
See application file for complete search history.

(56) References Cited

U.S. PATENT DOCUMENTS

| 5,260,913 | A | * | 11/1993 | Kadota et al. ............... 367/140 |
| 6,025,636 | A | * | 2/2000 | Nakahata et al. ............ 257/416 |
| 6,437,668 | B1 | | 8/2002 | Nakao et al. |
| 2001/0008387 | A1 | * | 7/2001 | Taniguchi ................... 333/193 |
| 2002/0135267 | A1 | * | 9/2002 | Takamine ............... 310/313 R |
| 2002/0158549 | A1 | * | 10/2002 | Itakura et al. ........... 310/313 R |
| 2004/0174233 | A1 | * | 9/2004 | Takayama et al. .......... 333/193 |
| 2005/0099091 | A1 | * | 5/2005 | Mishima et al. ......... 310/313 R |
| 2007/0132339 | A1 | * | 6/2007 | Nishiyama et al. ...... 310/313 R |

FOREIGN PATENT DOCUMENTS

| JP | 58-030216 A | 2/1983 |
| JP | 05-251989 A | 9/1993 |

(Continued)

OTHER PUBLICATIONS

Official communication issued in the counterpart Korean Application No. 10-2006-7011807, mailed on Mar. 30, 2007.

(Continued)

*Primary Examiner*—Walter Benson
*Assistant Examiner*—Derek J Rosenau
(74) *Attorney, Agent, or Firm*—Keating & Bennett, LLP

(57) ABSTRACT

A boundary acoustic wave device includes a solid layer laminated onto a single crystal substrate, electrodes provided between the single crystal substrate and the solid layer, and boundary acoustic wave elements provided on the single crystal substrate having the same cut angle, wherein the propagation direction of one of the boundary acoustic wave elements is different from that of at least one of the other boundary acoustic wave elements. A compact and high-performance boundary acoustic wave device using a boundary acoustic wave is provided by increasing the steepness of a filter band and by forming filters or resonators with different fractional bandwidths on a single substrate.

33 Claims, 27 Drawing Sheets

FOREIGN PATENT DOCUMENTS

| | | |
|---|---|---|
| JP | 06-268475 A | 9/1994 |
| JP | 07-283688 A | 10/1995 |
| JP | 9-107264 A | 4/1997 |
| JP | 10-084247 A | 3/1998 |
| JP | 10-093375 A | 4/1998 |
| JP | 10-335974 A | 12/1998 |
| JP | 11-136081 A | 5/1999 |
| JP | 2000-323955 A | 11/2000 |
| JP | 2002-152003 A | 5/2002 |
| WO | 98/52279 A1 | 11/1998 |

OTHER PUBLICATIONS

Yamanouchi et al.; "Piezoelectric Acoustic Boundary Waves Propagating Along the Interface Between SiO2 and LiTaO3"; IEEE Transactions on Sonics and Ultrasonics; Nov. 1978; pp. 384-389.

Yamashita et al.; "Highly Piezoelectric Boundary Waves in Si/SiO2/LiNbO3 Structure"; Faculty of Electric and Electronics Engineering; Chiba University; 26th Symposium; May 1997; pp. 53-58.

Yamashita et al.; "Highly Piezoelectric SH- Type Boundary Waves", Technical Report of IEICE; vol. 96, No. 249; pp. 21-26; Sep. 1996.

Official Communication issued in the International Application No. PCT/JP2004/017929, dated Mar. 29, 2005.

Official communication issued in counterpart Japanese Application No. 2005-516287, mailed on Mar. 17, 2009.

Official communication issued in counterpart Chinese Application No. 200480037310.5, dated May 8, 2009.

Irino et al., "Zero Slope Temperature SiO2/LiTaO3 Structure Substrate for Stoneley Waves" (C vol. J70-C No. 7, Jul. 1987, pp. 1070-1075).

* cited by examiner

ELECTROMECHANICAL COEFFICIENT $k^2$ OF STONELEY WAVE (%)

BOUNDARY ACOUSTIC WAVE DEVICE

FIELD OF THE INVENTION

The present invention relates to a boundary acoustic wave device using a boundary acoustic wave, and more particularly, relates to a boundary acoustic wave device having a structure in which electrodes are disposed at a boundary between a single crystal substrate and a solid layer.

DESCRIPTION OF THE RELATED ART

Heretofore, various surface acoustic wave devices have been used for RF and IF filters in mobile phones, resonators in VCOs, VIF filters in televisions, and the like. Surface acoustic wave devices use a surface acoustic wave, such as a Rayleigh wave or a first leaky wave, which propagates along a surface of a medium.

However, in propagating along a surface of a medium, a surface acoustic wave is sensitive to the changes in surface conditions of the medium. Accordingly, in order to protect the surface of the medium along which a surface acoustic wave propagates, a surface acoustic wave element has been hermetically sealed in a package in which a cavity portion is provided so as to face the wave-propagating surface. When the package having a cavity portion as described above is used, the cost of the surface acoustic wave device is inevitably increased. In addition, since the size of the package is much larger than that of the surface acoustic wave element, the overall size of the surface acoustic wave device is inevitably increased.

On the other hand, in addition to the above-described surface acoustic waves, a boundary acoustic wave is present which propagates along a boundary between solid materials.

For example, in "Piezoelectric Acoustic Boundary Waves Propagating Along the Interface Between $SiO_2$ and $LiTaO_3$" IEEE Transactions Sonics and Ultrasonics, VOL. SU-25, No. 6, pp. 384-389, 1978 IEEE (Non-Patent Document 1), it has been disclosed that an IDT is provided on a 126° rotated Y plate X-propagation $LiTaO_3$ substrate and that a $SiO_2$ film having a predetermined thickness is provided on the $LiTaO_3$ substrate and the IDT. In this document, it is disclosed that an SV+P type boundary acoustic wave propagates, which is a so-called Stoneley wave. Also in this document, it is disclosed that when the thickness of the $SiO_2$ film is 1.0 λ (λ indicates the wavelength of a boundary acoustic wave), an electromechanical coefficient of 2% is obtained.

The boundary acoustic wave propagates in the state in which energy is concentrated at a boundary portion between solid substrates. Hence, since energy is not substantially present on the bottom surface of the $LiTaO_3$ substrate and the surface of the $SiO_2$ film, the properties are not changed due to the change in surface conditions of the substrate and the thin film. Accordingly, a package having a cavity portion is not required, and hence the overall size of the boundary acoustic wave device can be reduced.

In addition, in "Highly Piezoelectric Boundary Waves in $Si/SiO_2/LiNbO_3$ Structure" (26th EM symposium, May 1997, pp. 53 to 58) (Non-Patent Document 2), an SH type boundary acoustic wave has been disclosed which propagates in a [001]-Si(110)/$SiO_2$/Y-cut X-propagation $LiNbO_3$ structure. This SH type boundary acoustic wave is characterized in that an electromechanical coefficient $k^2$ is large as compared to that of the above-described Stoneley wave. In addition, in the case of the SH type boundary acoustic wave, a package having a cavity portion is not required as in the case of the Stoneley wave. Furthermore, since the SH type boundary acoustic wave is an SH type wave, it is expected that the reflection coefficient of strips forming an IDT reflector is large as compared to that in the case of the Stoneley wave. Hence, for example, when a resonator or a resonator type filter is provided, miniaturization can be achieved by using the SH type boundary acoustic wave, and in addition, it is also expected that steeper properties can be obtained.

In a boundary acoustic wave device, a large electromechanical coefficient, a small propagation loss, a small power flow angle, and a small temperature coefficient of frequency are required. The loss caused by the propagation of a boundary acoustic wave, that is, the propagation loss, may degrade the insertion loss of a boundary acoustic wave filter or may also degrade the resonant resistance or the impedance ratio of a boundary acoustic wave resonator, the impedance ratio being a ratio between the impedance at a resonant frequency and that at an antiresonant frequency. Hence, the propagation loss is preferably decreased to as small as possible.

The power flow angle is an angle indicating the difference between the direction of the phase velocity of a boundary acoustic wave and the direction of the group velocity of energy thereof. When the power flow angle is large, it is necessary to obliquely dispose an IDT in conformity with the power flow angle. Hence, electrode designing becomes complicated. In addition, the loss caused by the deviation in angle is liable to be generated.

Furthermore, when an operating frequency of a boundary acoustic wave device is changed by the temperature, the practical pass band and stop band are decreased in the case of a boundary acoustic wave filter. In the case of a resonator, when an oscillation circuit is provided, the above change in operating frequency caused by the temperature results in abnormal oscillation. Hence, the change in frequency per degree centigrade, which is TCF, is preferably decreased to as small as possible.

For example, when reflectors are disposed along a propagation direction and outside a region in which a transmitting IDT and a receiving IDT are provided, which transmit and receive a boundary acoustic wave, respectively, a low-loss resonator type filter can be provided. The band width of this resonator type filter depends on the electromechanical coefficient of a boundary acoustic wave. When the electromechanical coefficient $k^2$ is large, a broadband filter can be obtained, and when the electromechanical coefficient $k^2$ is small, a narrowband filter is obtained. Hence, it is necessary that the electromechanical coefficient $k^2$ of a boundary acoustic wave used for a boundary acoustic wave device be appropriately determined in accordance with its application. In an RF filter for mobile phones, the electromechanical coefficient $k^2$ is required to be 5% or more.

However, in the boundary acoustic wave device using a Stoneley wave, disclosed in the above-described Non-Patent Document 1, the electromechanical coefficient $k^2$ is small, such as 2%.

In addition, in the $Si/SiO_2/LiNbO_3$ structure disclosed in the above-described Non-Patent Document 2, in order to actually excite a boundary acoustic wave, a complicated four-layered structure of $Si/SiO_2/IDT/LiNbO_3$ had to be provided, as shown in FIG. 1 of Japanese Unexamined Patent Application Publication No. 10-84247. Furthermore, when Si was actually disposed in the [001]-Si(110) direction as the proposed optimum condition, a bonding process with a high degree of difficulty had to be performed as disclosed in Japanese Unexamined Patent Application Publication No. 10-84247. In general, in the case of a wafer having a diameter of 3 inches or more, which is used for mass production, it has been difficult to uniformly bond wafers together by a bonding process. In addition, after the wafer bonding is carried out, when cutting is performed to form chips, inconveniences such as peeling are liable to occur.

As for the SH type boundary acoustic wave, as described in "Highly Piezoelectric SH-type Boundary Waves" Technical Report of IEICE, 09/1996, US96-48, pp. 21-26, published by The Institute of Electronics, Information and Communication Engineers (Non-Patent Document 3), in the structure made of an isotropic substance and a BGSW substrate, the SH type boundary acoustic wave can be obtained when the acoustic velocity of a transverse wave of the isotropic substance and that of the BGSW substrate are close to each other, the density ratio is small, and the piezoelectric properties are strong,.

SUMMARY OF THE INVENTION

In order to overcome the problems described above, preferred embodiments of the present invention provide a boundary acoustic wave device in which the electromechanical coefficient, which is a main response of an SH boundary acoustic wave, is large, the transmission loss and the power flow angle are small, and a spurious signal caused by a Stoneley wave in the vicinity of the main response is small.

Another preferred embodiment of the present invention provides a boundary acoustic wave device in which the electromechanical coefficient, which is the main response of an SH type boundary acoustic wave, can be easily adjusted.

In accordance with another preferred embodiment of the present invention, there is provided a boundary acoustic wave device using a non-leaky propagation type boundary acoustic wave, including boundary acoustic wave elements which are formed using a single crystal substrate having the same cut angle. In the boundary acoustic wave device described above, the boundary acoustic wave elements each include the single crystal substrate, a solid layer provided thereon, and electrodes provided at a boundary between the single crystal substrate and the solid layer. In the boundary acoustic wave elements, the propagation direction of a boundary acoustic wave of at least one of the boundary acoustic wave elements is different from that of at least one of the other boundary acoustic wave elements.

In preferred embodiments of the present invention, although not being particularly limited, the boundary acoustic wave elements may be boundary acoustic wave filters or boundary acoustic wave resonators, for example.

In the boundary acoustic wave device according to another preferred embodiment of the present invention, the boundary acoustic wave elements preferably have a resonator structure.

In accordance with a specific preferred embodiment of the boundary acoustic wave device of the present invention, there is provided a longitudinally coupled filter as the boundary acoustic wave device.

In accordance with another specific preferred embodiment of the boundary acoustic wave device of the present invention, the boundary acoustic wave elements are preferably provided on one piezoelectric single crystal substrate.

In accordance with another specific preferred embodiment of the boundary acoustic wave device of the present invention, the electromechanical coefficient of at least one of the boundary acoustic wave elements is preferably different from that of at least one of the other boundary acoustic wave elements.

In accordance with another specific preferred embodiment of the boundary acoustic wave device of the present invention, the band width of at least one of the boundary acoustic wave elements is preferably different from that of at least one of the other boundary acoustic wave elements.

In accordance with another specific preferred embodiment of the boundary acoustic wave device of the present invention, the thickness of the electrodes is preferably set so that the acoustic velocity of the SH type boundary acoustic wave is lower than the acoustic velocity of a slow transverse wave propagating through the solid layer and the acoustic velocity of a slow transverse wave propagating through the piezoelectric single crystal substrate.

In accordance with another specific preferred embodiment of the boundary acoustic wave device of the present invention, the duty ratio of the electrodes is preferably set so that the acoustic velocity of the SH type boundary acoustic wave is lower than the acoustic velocity of a slow transverse wave propagating through the solid layer and the acoustic velocity of a slow transverse wave propagating through the piezoelectric single crystal substrate.

In preferred embodiments of the present invention, when the density of the electrodes, the thickness of the electrodes, and the wavelength of a boundary acoustic wave are represented by $\rho$ (kg/m$^3$), H, and $\lambda$, respectively, it is preferable that $H/\lambda > 8261.744 \rho^{-1.376}$ be satisfied. In addition, it is more preferable that $\rho > 3,745$ kg/m$^3$ be satisfied. Furthermore, it is even more preferable that $33,000.39050 \rho^{-1.50232} < H/\lambda < 88,818.90913 \rho^{-1.54998}$ be satisfied.

In accordance with another specific preferred embodiment of the boundary acoustic wave device of the present invention, the piezoelectric single crystal substrate is preferably a LiNbO$_3$ substrate, $\phi$ of Euler angles ($\phi$, $\theta$, $\psi$) of the LiNbO$_3$ substrate is preferably in the range of about $-31°$ to about $31°$, and $\theta$ and $\psi$ are preferably in the range surrounded by points A1 to A13 shown in the following Table 1.

TABLE 1

| Points | $\psi$ (°) | $\theta$ (°) |
|---|---|---|
| A01 | 0 | 116 |
| A02 | 11 | 118 |
| A03 | 20 | 123 |
| A04 | 25 | 127 |
| A05 | 33 | 140 |
| A06 | 60 | 140 |
| A07 | 65 | 132 |
| A08 | 54 | 112 |
| A09 | 48 | 90 |
| A10 | 43 | 87 |
| A11 | 24 | 90 |
| A12 | 0 | 91 |
| A13 | 0 | 116 |

In accordance with another specific preferred embodiment of the boundary acoustic wave device of the present invention, the electrodes each include a main electrode layer formed of a material selected from the group consisting of Au, Ag, Cu, Al, Fe, Ni, W, Ta, Pt, Mo, Cr, Ti, ZnO, and ITO.

In accordance with another specific preferred embodiment of the boundary acoustic wave device of the present invention, the electrodes each further include a second electrode layer laminated on the main electrode layer.

In accordance with another specific preferred embodiment of the boundary acoustic wave device of the present invention, the solid layer preferably includes a dielectric substance. Preferably, the dielectric substance is formed of a material primarily composed of SiO$_2$.

In accordance with another specific preferred embodiment of the boundary acoustic wave device of the present invention, the solid layer is formed of laminates which are each formed by laminating a plurality of material layers.

In addition, in accordance with another specific as preferred embodiment of the boundary acoustic wave device of the present invention, the solid layer preferably has the structure in which a layer primarily composed of $SiO_2$ and a layer primarily composed of Si are laminated to each other.

In accordance with another specific preferred embodiment of the boundary acoustic wave device of the present invention, the solid layer is formed of at least a material selected from the group consisting of Si, $SiO_2$, glass, silicon nitride, silicon carbide, ZnO, $Ta_2O_5$, titanate zirconate lead piezoelectric ceramic, aluminum nitride, $Al_2O_3$, $LiTaO_3$, and $LiNbO_3$.

In accordance with another specific preferred embodiment of the boundary acoustic wave device of the present invention, a resin layer is preferably further provided on the solid layer so as to be adhered thereto.

In the boundary acoustic wave device according to a preferred embodiment of the present invention, boundary acoustic wave elements are provided using a single crystal substrate having the same cut angle, the boundary acoustic wave elements each include the single crystal substrate, a solid layer, and electrodes provided at a boundary between the single crystal substrate and the solid layer. Of the boundary acoustic wave elements, the propagation direction of a boundary acoustic wave of at least one of the boundary acoustic wave elements is preferably different from that of at least one of the other boundary acoustic wave elements. Accordingly, a boundary acoustic wave device having various band characteristics, such as broadband filter characteristics and narrowband filter characteristics, can be easily provided by using a plurality of boundary acoustic wave elements which have different propagation directions of a boundary acoustic wave.

In addition, in a leaky propagation type surface acoustic wave device represented by a 36° Y-cut X-propagation $LiTaO_3$ substrate, for example, the propagation loss becomes approximately zero only when the surface acoustic wave propagates at a specific propagation angle such as 0° direction with respect to the crystal axis X, and when the propagation angle is shifted from the above value, the propagation loss is disadvantageously increased.

On the other hand, since the non-leaky propagation type boundary acoustic wave is preferably used in the present invention, even when the propagation angle is changed, the propagation loss can be made 0 dB/$\lambda$, and as a result, a boundary acoustic wave device having a low loss can be provided.

When the above boundary acoustic wave device is a boundary acoustic wave filter or a boundary acoustic wave resonator, in accordance with a preferred embodiment of the present invention, a boundary acoustic wave filter and a boundary acoustic wave resonator having various band characteristics can be provided.

In a preferred embodiment of the present invention, by changing the propagation direction of a boundary acoustic wave, for example, the electromechanical coefficient can be adjusted, and as a result, the insertion loss can be varied in the case of a transversal filter having no resonance structure. Furthermore, in a boundary acoustic wave resonator, a ladder filter, a longitudinally coupled multimode type boundary acoustic wave filter and the like, which have a resonance structure, the frequency interval between the resonant frequency and antiresonant frequency can be adjusted in proportion to the electromechanical coefficient in the case of the resonator, and in the case of the ladder filter or longitudinally coupled multimode type boundary acoustic wave filter, which exploits the resonator, the pass band can be adjusted in proportion to the electromechanical coefficient.

In a preferred embodiment of the present invention, when the boundary acoustic wave elements are provided on one piezoelectric single crystal substrate, a boundary acoustic wave device having various band characteristics can be provided as a chip component.

In a preferred embodiment of the present invention, when the electromechanical coefficient of at least one boundary acoustic wave element is different from that of at least one of the other boundary acoustic wave elements, various band widths can be easily achieved by changing the electromechanical coefficients of the boundary acoustic wave elements.

When the band width of at least one boundary acoustic wave element is different from that of at least one of the other boundary acoustic wave elements, various band characteristics can be obtained by a combination of band widths.

In a preferred embodiment of the present invention, when the thickness of the electrodes is set so that the acoustic velocity of an SH type boundary acoustic wave is lower than the acoustic velocity of a slow transverse wave propagating through the solid layer and the acoustic velocity of a slow transverse wave propagating through the piezoelectric single crystal substrate, a boundary acoustic wave device using an SH type boundary acoustic wave can be provided.

When the duty ratio of the electrodes is set so that the acoustic velocity of an SH type boundary acoustic wave is lower than the acoustic velocity of a slow transverse wave propagating through the solid layer and the acoustic velocity of a slow transverse wave propagating through the piezoelectric single crystal substrate, in accordance with a preferred embodiment of the present invention, a boundary acoustic wave device using an SH type boundary acoustic wave can be reliably provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1A:
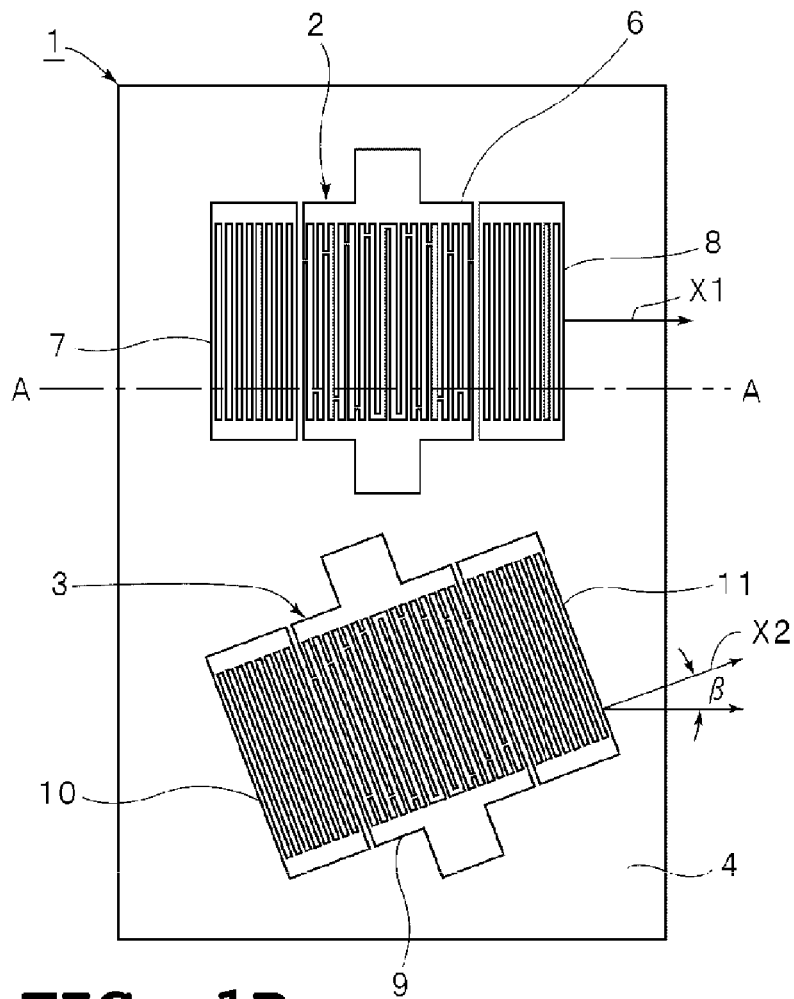
FIGS. 1A and 1B are a plan view showing a boundary acoustic wave device of a first preferred embodiment according to the present invention and a cross-sectional view taken along an A-A line shown in FIG. 1A, respectively.

Hereinafter, particular preferred embodiments of the present invention will be described so as to clearly disclose the present invention.

In order to propagate a boundary acoustic wave between two solid layers, the condition that energy of the boundary acoustic wave is concentrated between the solid layers must be satisfied. As described above, a method has been disclosed in Non-Patent Document 3, in which the transverse acoustic velocity of the isotropic substance is made close to that of the BGSW substrate, the density ratio is small, and a material having strong piezoelectric properties is selected.

Incidentally, in general, when a high velocity region and a low velocity region are present, the wave is concentrated and propagates at a portion at which the acoustic velocity is low. The inventor of the present invention discovered that the condition in that energy is concentrated between solid layers can be satisfied when the acoustic velocity of a boundary acoustic wave propagating between the solid layers is decreased by increasing the thickness of electrodes using a metal material, such as Au, which has a high density and a low acoustic velocity as an electrode material provided between the solid layers.

Heretofore, it has been known that as bulk waves propagating in a solid substance, three types of waves, that is, a longitudinal wave, a fast transverse wave, and a slow transverse wave are present, and that they are called a P wave, an SH wave, and a SV wave, respectively. Whether the SH wave or the SV wave becomes a slow transverse wave is determined by the anisotropic properties of a base material. Among the above three types of bulk waves, a bulk wave having the lowest acoustic velocity is a slow transverse wave. When the solid substance is an isotropic substance such as $SiO_2$, since only one type of transverse wave propagates therethrough, this transverse wave is a slow transverse wave.

On the other hand, in a boundary acoustic wave propagating through an anisotropic base material such as a piezoelectric substrate, in most cases, three displacement components of the P wave, SH wave, and SV wave propagate while being coupled with each other, and by the primary component, the type of boundary acoustic wave is determined. For example, the Stoneley wave is a boundary acoustic wave primarily composed of the P wave and the SV wave, and the SH type boundary acoustic wave is a boundary acoustic wave primarily composed of the SH component. In addition, depending on the conditions, the SH wave component and the P wave or the SV wave component may propagate in some cases without being coupled with each other.

In the boundary acoustic wave, since the above three displacement components propagate while being coupled with each other, for example, in a boundary acoustic wave having an acoustic velocity faster than that of the SH wave, the SH component and the SV component leak, and in a boundary acoustic wave having an acoustic velocity faster than that of the SV wave, the SV component leaks. This leaky-wave component causes the propagation loss of the boundary acoustic wave.

Accordingly, when the acoustic velocity of the SH type boundary acoustic wave is decreased lower than the acoustic velocities of slow transverse waves of the above two solid layers, energy of the SH type boundary acoustic wave can be concentrated around electrodes disposed between the two solid layers, and as a result, the conditions can be obtained in which the propagation loss is zero. In addition, when at least one of the solid layers is formed from a piezoelectric substance, and a dielectric substance containing a piezoelectric substance is used as the other solid layer, the SH type boundary acoustic wave can be excited when the electrodes are disposed between the solid layers. The electrodes may include comb electrodes or interdigital electrodes as disclosed, for example, by Mikio SHIBAYAMA in "Surface Acoustic Wave Technology" pp. 57 to 58, published by The Institute of Electronics, Information and Communication Engineers. The above-described structure is a simple structure in which electrodes are disposed between two solid layers. In addition, by the above-described structure, the SH type boundary acoustic wave can be used by a combination of many materials. For example, in a $SiO_2$/IDT electrode/Y-X $LiNbO_3$ structure, although excitation of the SH type boundary acoustic wave has not been confirmed, when the thickness of the electrodes is increased, the SH type boundary acoustic wave is present.

In addition, in the case of an IDT and a grating reflector, when the ratio of a strip line width to the placement period of strips forming the IDT and the grating reflector, that is, the duty ratio is increased while the acoustic velocity of a slow transverse wave is made close to that of the boundary acoustic wave by increasing the electrode thickness, the acoustic velocity of the SH type boundary acoustic wave can be decreased lower than that of the slow transverse wave.

Figure 1B:
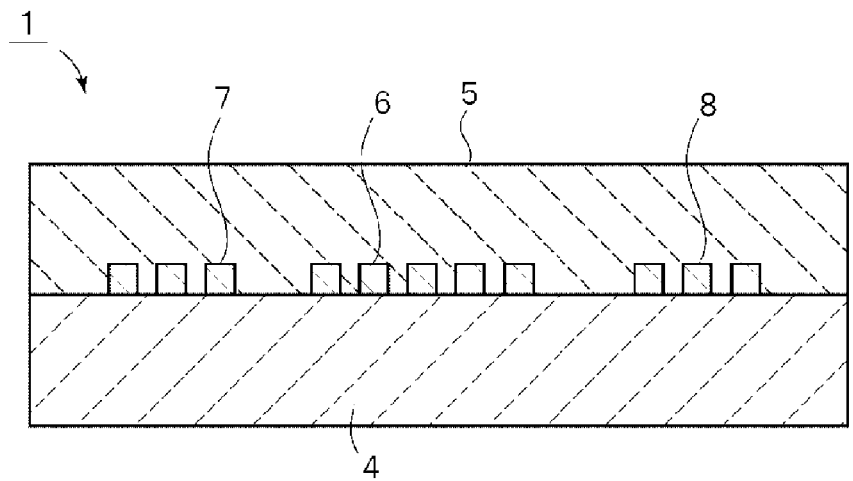

FIGS. 1A and 1B are views for illustrating a boundary acoustic wave device of a first preferred embodiment according to the present invention. FIG. 1A is a schematic plan view showing electrode structures, and FIG. 1B is a front cross-sectional view schematically showing a portion taken along a line A-A shown in FIG. 1A.

As shown in FIG. 1A, in a boundary acoustic wave device 1, in order to form a first boundary acoustic wave element 2 and a second boundary acoustic wave element 3, the electrode structures are provided.

In addition, as shown in FIG. 1B, in the boundary acoustic wave device 1, a solid layer 5 is provided on an upper surface of a plate-shaped single crystal substrate 4, and the above-described electrode structures are provided at the boundary between the single crystal substrate 4 and the solid layer 5.

In particular, the single crystal substrate 4 used in this preferred embodiment is formed of a Y plate X-propagation LiNbO$_3$ substrate with Euler angles (0°, 90°, 0°) which functions as a piezoelectric crystal. In addition, the solid layer 5 is formed of SiO$_2$ which functions as a dielectric substance. Since the solid layer 5 is composed of SiO$_2$, it can be easily formed by a thin-film forming method. In addition, SiO$_2$ has a temperature coefficient of frequency TCF for counteracting a temperature coefficient of frequency TCF of LiNbO$_3$. Hence, when the solid layer composed of SiO$_2$ is used, the temperature characteristics can be improved.

In addition, the electrode structure of the boundary acoustic wave element 2 has interdigital electrodes 6 and reflectors 7 and 8 disposed at two sides of the interdigital electrodes 6 along the propagation direction of a boundary acoustic wave. The interdigital electrodes 6 have a plurality of electrode fingers which interdigitate with each other, and the grating reflectors 7 and 8 each have a plurality of electrode fingers which are short-circuited at two ends. That is, the boundary acoustic wave element 2 is a one-port type resonator.

The second boundary acoustic wave element 3 is also a one-port type resonator and has interdigital electrodes 9 and reflectors 10 and 11.

The first and the second boundary acoustic wave elements 2 and 3 are each configured by providing the above-described electrode structure between the piezoelectric crystal substrate 4 and the solid layer 5. That is, in this preferred embodiment, the boundary acoustic wave elements 2 and 3 are formed by using the same piezoelectric crystal substrate 4. In addition, in a preferred embodiment of the present invention, a plurality of boundary acoustic wave elements may be formed by using different piezoelectric crystal substrates.

The electrode structures described above may be formed by using an optional metal material. In this preferred embodiment, the electrode structures are preferably formed from Au.

In addition, the feature of the boundary acoustic wave device 1 of this preferred embodiment is that the propagation direction of the boundary acoustic wave of the first boundary acoustic wave element 2 is different from that of the second boundary acoustic wave element 3. That is, a propagation direction X1 of the boundary acoustic wave of the first boundary acoustic wave element 2 is different from a propagation direction X2 of the boundary acoustic wave of the second boundary acoustic wave element 3. As shown in FIG. 1A, the boundary acoustic wave elements 2 and 3 are arranged so that the propagation direction X2 has an angle β with respect to the propagation direction X1. The principle and function of the boundary acoustic wave device 1 of this preferred embodiment will be described in more particular detail with reference to the experimental examples.

Experimental Example 1

In the case in which electrodes were provided between a solid layer of SiO$_2$ and a single crystal LiNbO$_3$ substrate with Euler angles (0°, 90°, 0°) by using electrode materials having different densities, the relationships of an electrode thickness H/λ (in which H indicates the thickness, and λ indicates the wavelength of an SH type boundary acoustic wave) with the acoustic velocity, a propagation loss α, an electromechanical coefficient k$^2$ (%), a temperature coefficient of frequency TCF (ppm/° C.), and a power flow angle (PFA) of a boundary acoustic wave are shown in FIGS. 2 to 6, respectively.

The results shown in FIGS. 2 to 6 were obtained by calculation based on a method disclosed in "A Method For Estimating Optimal Cuts and Propagation Directions for Excitation and Propagation Directions for Excitation of Piezoelectric Surface Waves" (J. J. Campbell and W. R. Jones, IEEE Transactions on Sonics and Ultrasonics, Vol. SU-15 (1968) pp. 209 to 217).

In the case of a free boundary, the acoustic velocity and the propagation loss were obtained based on the assumption in which the displacements, the potentials, the normal line components of an electric flux density, and the stresses in the up and down direction at respective boundaries between SiO$_2$ and Au and between Au and LiNbO$_3$ were continuous, the thickness of SiO$_2$ and that of LiNbO$_3$ were infinite, and the relative dielectric constant of Au was 1. In addition, in the case of a short-circuit boundary, the potentials at the respective boundaries between SiO$_2$ and Au and between Au and LiNbO$_3$ were regarded as zero. In addition, the electromechanical coefficient k$^2$ was obtained by the following equation (1).

$$k^2 = 2 \times |Vf - V|/Vf \quad \text{Equation (1)}$$

In the above equation, Vf indicates the acoustic velocity of the free boundary.

The temperature coefficient of frequency TCF was obtained from phase velocities V at 20° C., 25° C., and 30° C. using the following equation (2).

$$TCF = V^{-1}(25° C.) \times [(V(30° C.) - V(20° C.)/10° C.)] - \alpha s \quad \text{Equation (2)}$$

In the above equation, αs indicates the coefficient of linear thermal expansion of the LiNbO$_3$ substrate in the propagation direction of the boundary acoustic wave.

In addition, the power flow angle PFA at optional Euler angles (φ, θ, ψ) was obtained from phase velocities V at angles of ψ"0.5°, ψ, and ψ+0.5° using the following equation (3).

$$PFA = \tan^{-1}[V^{-1}(\psi) \times (V(\psi+0.5°) - V(\psi-0.5°)] \quad \text{Equation (3)}$$

The acoustic velocities of a longitudinal wave, a fast transverse wave, and a slow transverse wave in the Y plate X-propagation LiNbO$_3$ are 6,547 m/sec, 4,752 m/sec, and 4,031 m/sec, respectively. In addition, the acoustic velocities of a longitudinal wave and a slow transverse wave of SiO$_2$ are 5,960 m/sec and 3,757 m/sec, respectively.

Figure 2:
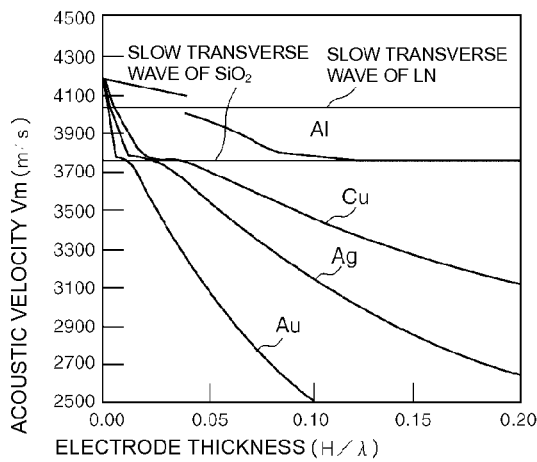
FIG. 2 is a graph showing the relationship between an acoustic velocity V and an electrode thickness H/$\lambda$, which is obtained when electrodes are provided between a piezoelectric substance and a dielectric substance by using electrode materials having different densities.
Figure 3:
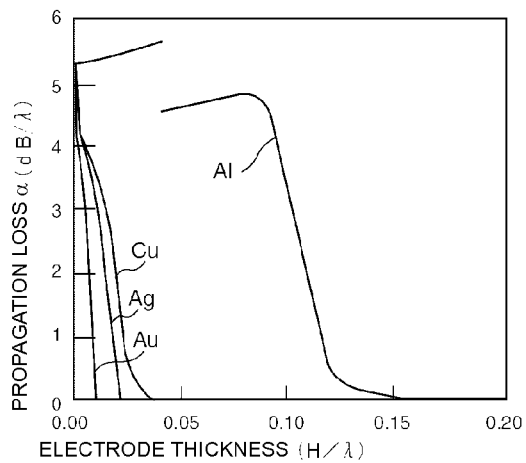
FIG. 3 is a graph showing the relationship between a propagation loss $\alpha$ and an electrode thickness H/$\lambda$, which is obtained when electrodes are provided between a piezoelectric substance and a dielectric substance by using electrode materials having different densities.

According to FIGS. 2 and 3, it is understood that at the thickness at which the acoustic velocity of the SH type boundary acoustic wave is not more than 3,757 m/sec which is the lowest velocity of the above longitudinal wave, fast transverse wave, and slow transverse wave, the propagation loss α of the SH type boundary acoustic wave can be decreased to zero by any type of electrode material.

Figure 7:
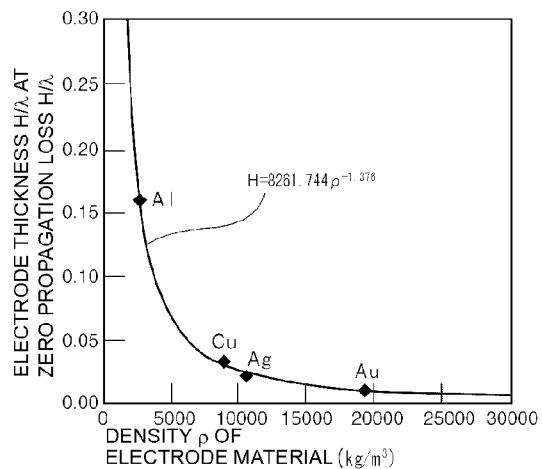
FIG. 7 is a graph showing the relationship between a density ρ of an electrode material and an electrode thickness H/λ at which a propagation loss of 0 is obtained.

FIG. 7 is a graph showing the relationship between a density ρ of the electrode material and an electrode thickness H at which the propagation loss of the SH type boundary acoustic wave becomes zero. As apparent from FIG. 7, it is understood that when the condition of the following equation (4) is satisfied, an SH type boundary acoustic wave having a propagation loss α of zero can be obtained.

$$H(\lambda) > 8{,}261.744\rho^{1.376}$$ Equation (4)

In addition, when this type of boundary acoustic wave device is manufactured, electrodes such as IDTs are formed on a piezoelectric substrate made of $LiNbO_3$ or the like by a photolithographic technique including lift-off, dry etching, or the like, and on the electrodes, a dielectric film made of $SiO_2$ or the like is formed by a deposition method, such as sputtering, evaporation, or CVD. Hence, by irregularities caused by the thickness of the IDT, the dielectric film may be obliquely grown or the film quality may become non-uniform, and as a result, the properties of the boundary acoustic wave device may be degraded in some cases. In order to avoid the degradation of the properties described above, the thickness of the electrodes is preferably decreased to as small as possible.

According to experiments carried out by the inventor of the present invention, when the film thickness H of the electrode material for the IDT or the like is 0.1 λ or more, because of the irregularities thereof, formation of a dielectric film having superior quality becomes very difficult, and hence the electrode thickness H is preferably decreased to 0.1 λ or less. Accordingly, from FIG. 7, it is understood that when an electrode material having a density ρ of 3,745 kg/m³ or more is used, the electrode thickness H can be decreased to 0.1 λ at which the propagation loss becomes zero.

Figure 4:
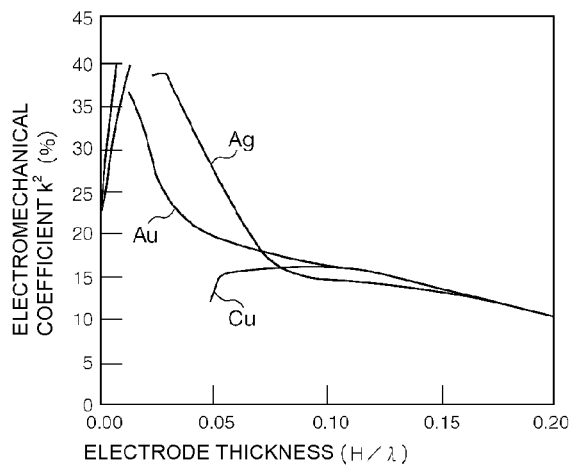
FIG. 4 is a graph showing the relationship between an electromechanical coefficient $k^2$ and an electrode thickness H/$\lambda$, which is obtained when electrodes are provided between a piezoelectric substance and a dielectric substance by using electrode materials having different densities.

In addition, as apparent from FIG. 4, at the electrode thickness which satisfies the above equation (4), the electromechanical coefficient $k^2$ is large, such as 10% to 38%, and hence it is understood that a broadband boundary acoustic wave device having a low loss can be provided.

Figure 5:
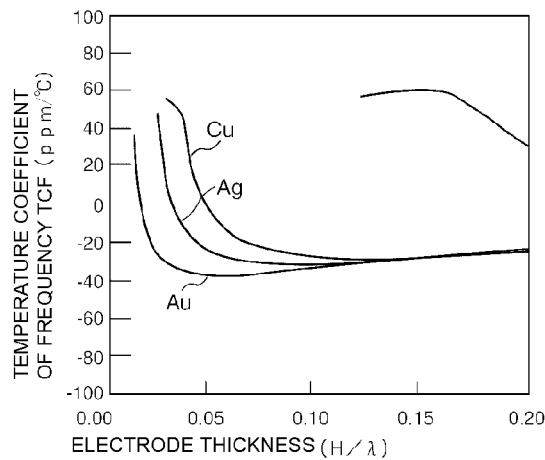
FIG. 5 is a graph showing the relationship between a temperature coefficient of frequency TCF and an electrode thickness H/$\lambda$, which is obtained when electrodes are provided between a piezoelectric substance and a dielectric substance by using electrode materials having different densities.

In addition, as apparent from FIG. 5, it is understood that the temperature coefficient of frequency TCF is in the range of –40 ppm/° C. to +40 ppm/° C. under most conditions and that by adjustment of the electrode thickness, the TCF can be decreased to ±20 ppm/° C. or less, to ±10 ppm/° C. or less, and further to ±0 ppm/° C.

Figure 8:
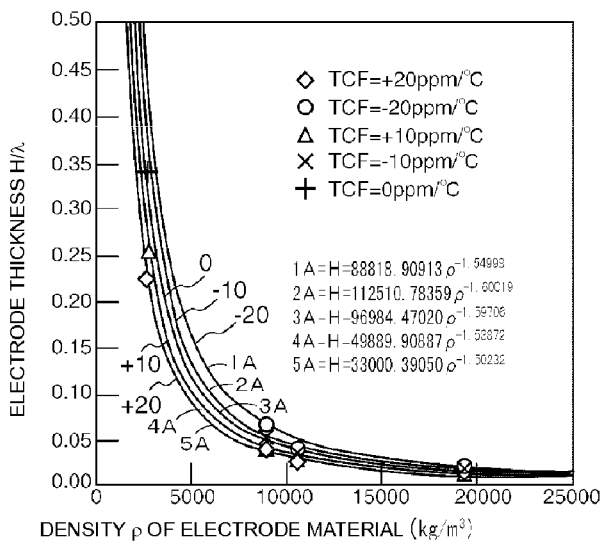
FIG. 8 is a graph showing the relationship between a density ρ of an electrode material and an electrode thickness H/λ at which TCFs of −20, −10, 0, +10, and +20 are obtained.

FIG. 8 is a graph showing points indicating the relationship between the density p of the electrode material and the electrode thickness H at which TCFs of –20 ppm/° C., –10 ppm/° C., 0 ppm/° C., +10 ppm/° C., and +20 ppm/° C. are obtained and also showing an approximation curve made from the above points. As apparent from FIG. 8, an electrode thickness H, at which the TCF is in a preferable range of –20 ppm/° C. to +20 ppm/° C., is in the range which satisfies the following equation (5); an electrode thickness H, at which the TCF is in a more preferable range of –10 ppm/° C. to +10 ppm/° C., is in the range which satisfies the following equation (6); and an electrode thickness H, at which the TCF most preferably becomes 0 ppm/° C., is obtained when the following equation (7) is satisfied.

$$33{,}000.39050\rho^{-1.50232} < H < 88{,}818.90913\rho^{-1.54998}$$ Equation (5)

$$49{,}889.90887\rho^{-1.53872} < H < 112{,}510.78359\rho^{-1.60018}$$ Equation (6)

$$H = 96{,}984.47020\rho^{1.59706}$$ Equation (7)

Figure 6:
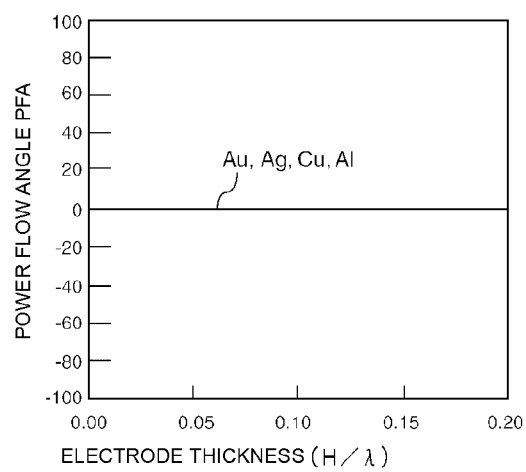
FIG. 6 is a graph showing the relationship between a power flow angle PFA and an electrode thickness H/$\lambda$, which is obtained when electrodes are provided between a piezoelectric substance and a dielectric substance by using electrode materials having different densities.

In addition, as apparent from FIG. 6, it is understood that the power flow angle PFA is superior, such as 0 at any film thickness H.

Experimental Example 2

Figure 9:
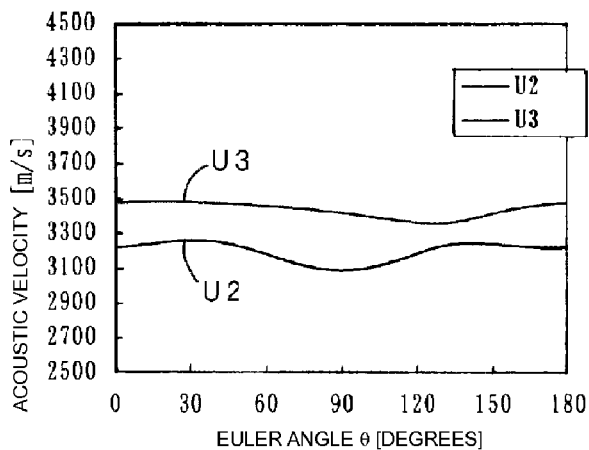
FIG. 9 is a graph showing the relationships of θ of the Euler angles with an acoustic velocity V of an SH type boundary acoustic wave (U2) and that of a Stoneley wave (U3), which are obtained in the structure in which Au electrodes are provided on a LiNbO₃ substrate with Euler angles (0°, θ, 0°) and in which a SiO₂ film is provided.
Figure 10:
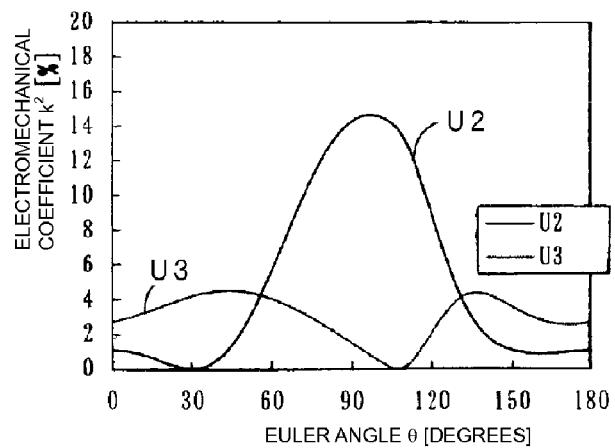
FIG. 10 is a graph showing the relationships of θ of the Euler angles with an electromechanical coefficient $k^2$ of an SH type boundary acoustic wave (U2) and that of a Stoneley wave (U3), which are obtained in the structure in which Au electrodes are provided on a LiNbO₃ substrate with Euler angles (0°, θ, 0°) and in which a SiO₂ film is provided.
Figure 11:
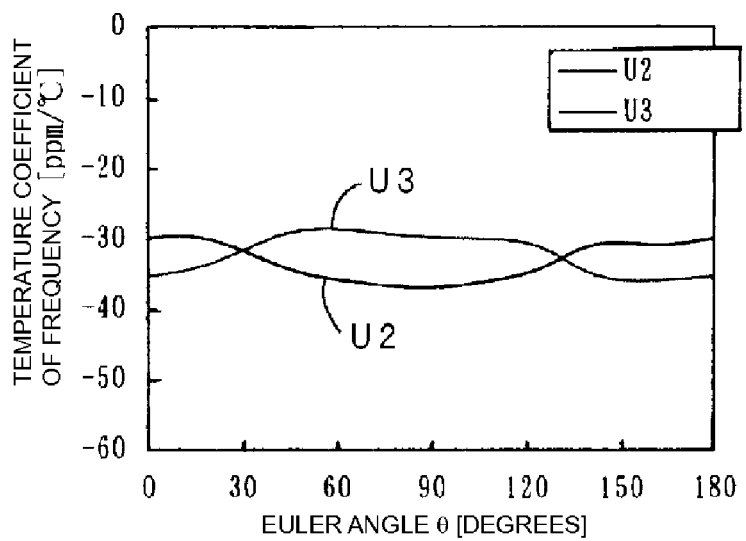
FIG. 11 is a graph showing the relationships of θ of the Euler angles with a temperature coefficient of frequency of an SH type boundary acoustic wave (U2) and that of a Stoneley wave (U3), which are obtained in the structure in which Au electrodes are provided on a LiNbO₃ substrate with Euler angles (0°, θ, 0°) and in which a SiO₂ film is provided.

Based on the results obtained in Experimental Example 1, electrodes of Au having a thickness of 0.05 λ were provided on a $LiNbO_3$ substrate with Euler angles (0°, θ, 0°), and a $SiO_2$ film was provided so as to cover the electrodes of Au. In this structure, the relationships of θ of the Euler angles of the $LiNbO_3$ substrate with the acoustic velocities V, the electromechanical coefficients $k^2$, the propagation losses α, the temperature coefficients of frequency TCF, and the power flow angles (PFA) of an SH type boundary acoustic wave and a Stoneley wave were measured. FIGS. 9 to 11 show the relationships of the Euler angle θ with the acoustic velocity, the electromechanical coefficient $k^2$, and the temperature coefficient of frequency TCF. In the entire region of θ=0° to 180°, the propagation loss α was 0 dB/λ and the power flow angle (PFA) was 0°.

In FIGS. 9 to 11, U2 indicates the SH type boundary acoustic wave, and U3 indicates the Stoneley wave which causes a spurious signal.

As apparent from FIG. 10, it is understood that when the Euler angle θ is 106°, the electromechanical coefficient $k^2$ of the Stoneley wave, which causes a spurious signal, becomes approximately 0%.

Next, electrodes of Au having a thickness of 0.06 λ were formed on a $LiNbO_3$ substrate with Euler angles (0°, θ, ψ), and a $SiO_2$ film was formed on the electrodes of Au, so that a boundary acoustic wave device was formed. In this structure, the relationships of θ and ψ of the Euler angles of the $LiNbO_3$ substrate with the acoustic velocities V, the electromechanical coefficients $k^2$, the propagation losses α, and the temperature coefficients of frequency TCF of the SH type boundary acoustic wave and the Stoneley wave were measured. The results of the SH type boundary acoustic wave are shown in FIG. 12, and the results of the Stoneley wave are shown in FIG. 13.

Figure 12:
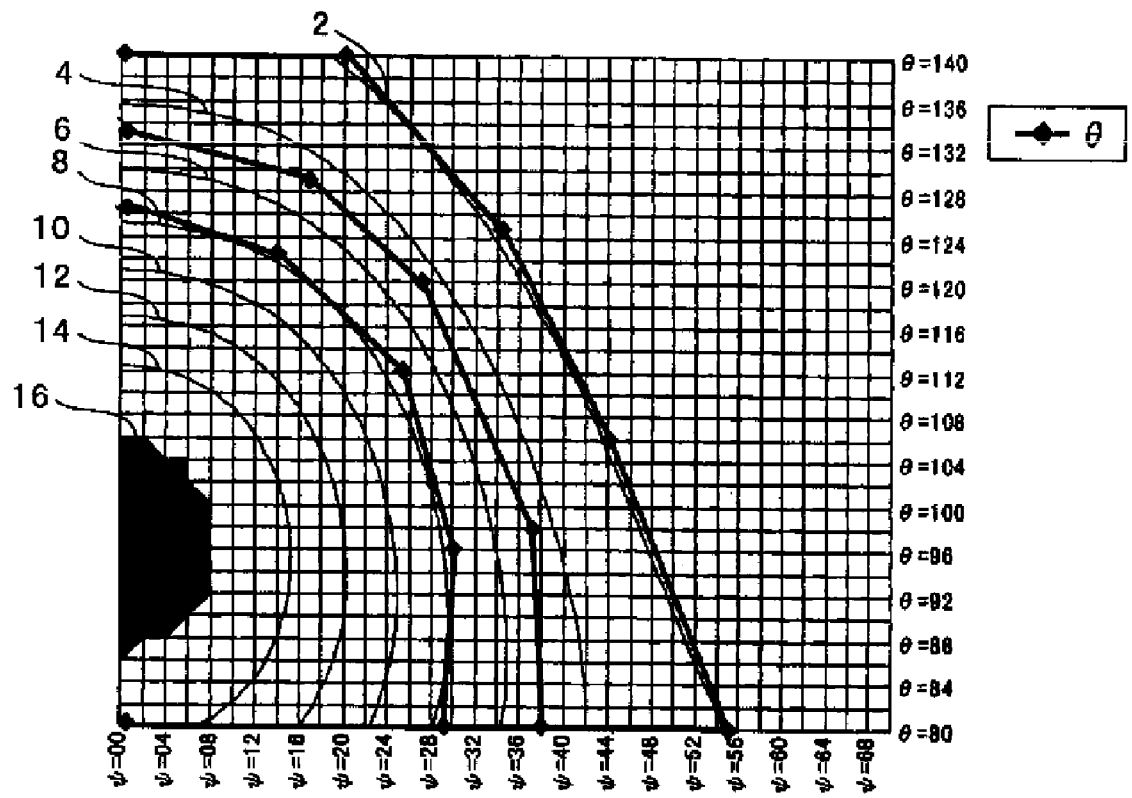
FIG. 12 is a graph showing the relationship between θ and ψ of the Euler angles and an electromechanical coefficient $k^2$ of an SH type boundary acoustic wave, which is obtained in Experimental Example 2 in which Au electrodes having a thickness of 0.06 λ are provided on a LiNbO₃ substrate with Euler angles (0°, θ, ψ), followed by formation of a SiO₂ film.
Figure 13:
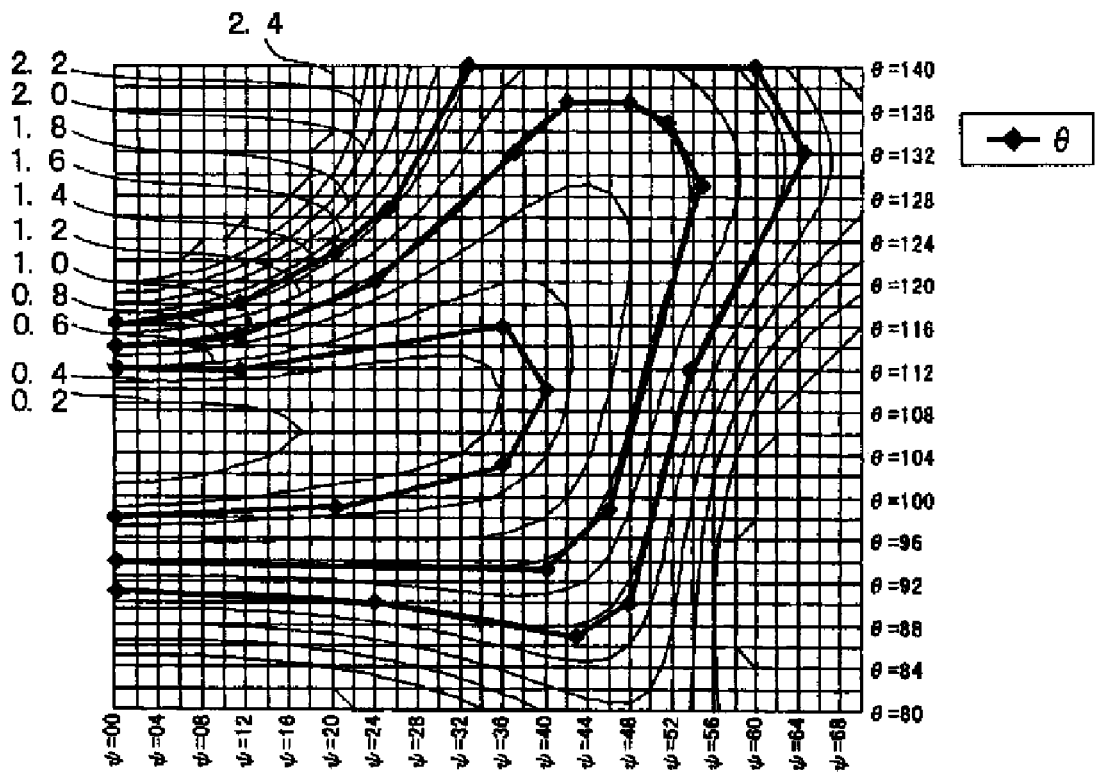
FIG. 13 is a graph showing the relationship between θ and ψ of the Euler angles and an electromechanical coefficient $k^2$ of a Stoneley wave, which is obtained in Experimental Example 2 in which Au electrodes having a thickness of 0.06 λ are provided on a LiNbO₃ substrate with Euler angles (0°, θ, ψ), followed by formation of a SiO₂ film.
Figure 14:
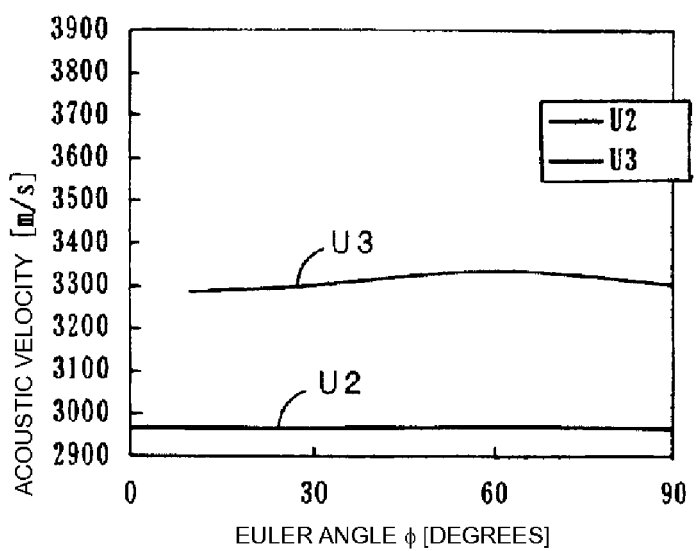
FIG. 14 is a graph showing the relationships of φ of the Euler angles with an acoustic velocity V of an SH type boundary acoustic wave and that of a Stoneley wave, which are obtained in Experimental Example 3 in which a LiNbO₃ substrate with Euler angles (φ, 105°, 0°) is used.
Figure 15:
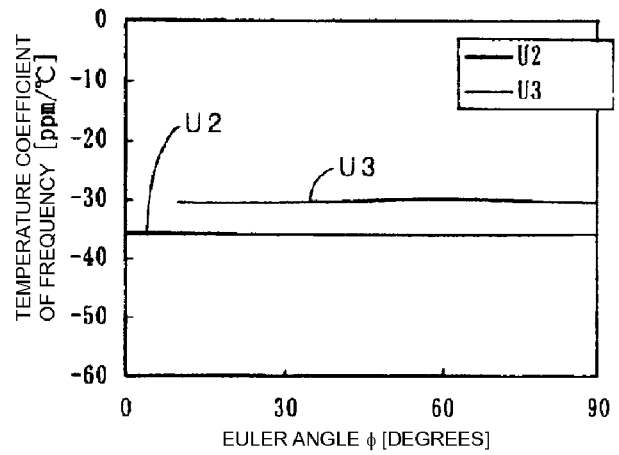
FIG. 15 is a graph showing the relationship between φ of the Euler angles and a temperature coefficient of frequency TCF, which is obtained in Experimental Example 3 in which a LiNbO₃ substrate with Euler angles (φ, 105°, 0°) is used.

In the entire regions shown in FIGS. 12 and 13, the propagation loss α was 0 dB/k. In addition, the velocity V and the temperature coefficient of frequency TCF were not significantly changed at φ of 0° shown in FIGS. 9 and 11. Hence, in FIGS. 12 and 13, the results of the electromechanical coefficient $k^2$ (%) are only shown.

As apparent from FIG. 13, the electromechanical coefficient $k^2$, which is a response of the Stoneley wave, is small, such as about 1.5% or less, in the region surrounded by points A01 to A13 shown in the following Table 2. In addition, the electromechanical coefficient k in the region surrounded by points B01 to B12 shown in the following Table 3 is 1.0% or less, and that in the region surrounded by points C01 to C08 shown in the following Table 4 is superior, such as 0.5% or less. In addition, the electromechanical coefficient, which is a response of the Stoneley wave, at Euler angles (0°, 106°, 0°) was approximately 0%.

TABLE 2

| Points | ψ (°) | θ (°) |
|---|---|---|
| A01 | 0 | 116 |
| A02 | 11 | 118 |
| A03 | 20 | 123 |
| A04 | 25 | 127 |
| A05 | 33 | 140 |
| A06 | 60 | 140 |
| A07 | 65 | 132 |
| A08 | 54 | 112 |
| A09 | 48 | 90 |
| A10 | 43 | 87 |
| A11 | 24 | 90 |
| A12 | 0 | 91 |

TABLE 2-continued

| Points | ψ (°) | θ (°) |
|---|---|---|
| A13 | 0 | 116 |

TABLE 3

| Points | ψ (°) | θ (°) |
|---|---|---|
| B01 | 0 | 114 |
| B02 | 11 | 115 |
| B03 | 24 | 120 |
| B04 | 37 | 132 |
| B05 | 42 | 137 |
| B06 | 48 | 137 |
| B07 | 52 | 135 |
| B08 | 55 | 129 |
| B09 | 46 | 99 |
| B10 | 40 | 93 |
| B11 | 0 | 94 |
| B12 | 0 | 114 |

TABLE 4

| Points | ψ (°) | θ (°) |
|---|---|---|
| C01 | 0 | 112 |
| C02 | 11 | 112 |
| C03 | 36 | 116 |
| C04 | 40 | 110 |
| C05 | 36 | 103 |
| C06 | 20 | 99 |
| C07 | 0 | 98 |
| C08 | 0 | 112 |

Next, as apparent from FIG. 12, the electromechanical coefficient $k^2$ of the SH type boundary acoustic wave is large, such as 2% or more, in the region surrounded by points F01 to F06 shown in the following Table 7 and is 5% or more in the region surrounded by points E01 to E07 shown in the following Table 6. In addition, the electromechanical coefficient $k^2$ is preferably large, such as 10% or more, in the region surrounded by points D1 to D07 shown in the following Table 5 and becomes maximum at Euler angles (0°, 97°, 0°).

TABLE 5

| Points | ψ (°) | θ (°) |
|---|---|---|
| D01 | 0 | 126 |
| D02 | 13 | 123 |
| D03 | 25 | 112 |
| D04 | 30 | 96 |
| D05 | 29 | 80 |
| D06 | 0 | 80 |
| D07 | 0 | 126 |

TABLE 6

| Points | ψ (°) | θ (°) |
|---|---|---|
| E01 | 0 | 133 |
| E02 | 16 | 129 |
| E03 | 27 | 120 |
| E04 | 37 | 98 |
| E05 | 38 | 80 |
| E06 | 0 | 80 |
| E07 | 0 | 133 |

TABLE 7

| Points | ψ (°) | θ (°) |
|---|---|---|
| F01 | 20 | 140 |
| F02 | 34 | 125 |
| F03 | 44 | 106 |
| F04 | 55 | 80 |
| F05 | 0 | 80 |
| F06 | 20 | 140 |

In addition, under conditions shown in Tables 2 to 7, it is confirmed that even when Ag, Cu, Al, Fe, Ni, W, Ta, Pt, Mo, Cr, Ti, ZnO, or ITO is used as the electrode material instead of Au, superior properties equivalent to those described above can also be obtained.

In addition, also in FIGS. 12 and 13 and Tables 2 to 7, when −ψ is used instead of ψ, and when θ+180° C. is used instead of θ, for example, a plus or a minus sign of the power flow angle is merely reversed, and it is confirmed that superior results equivalent to each other can be obtained.

Experimental Example 3

Next, electrodes of Au having a thickness of 0.06 λ were formed on respective LiNbO$_3$ substrates with Euler angles (φ, 105°, 0°) and Euler angles (0°, 105°, ψ), and SiO$_2$ films were formed to cover the electrodes of Au, so that boundary acoustic wave devices were provided. In this case, the relationships of the Euler angles θ and ψ of the LiNbO$_3$ substrates with the acoustic velocities V, the electromechanical coefficients $k^2$, the propagation losses α, the temperature coefficients of frequency TCF, and the power flow angles (PFA) of an SH type boundary acoustic wave (U2) and a Stoneley wave (U3) were measured. FIGS. 14 to 17 show the results obtained when the LiNbO$_3$ with Euler angles (φ, 105°, 0°) was used, and FIGS. 18 to 21 show the results obtained when the LiNbO$_3$ with Euler angles (0°, 105°, ψ) was used. In the entire region of φ of 0° to 90°, the propagation loss α is 0 dB/λ.

Figure 16:
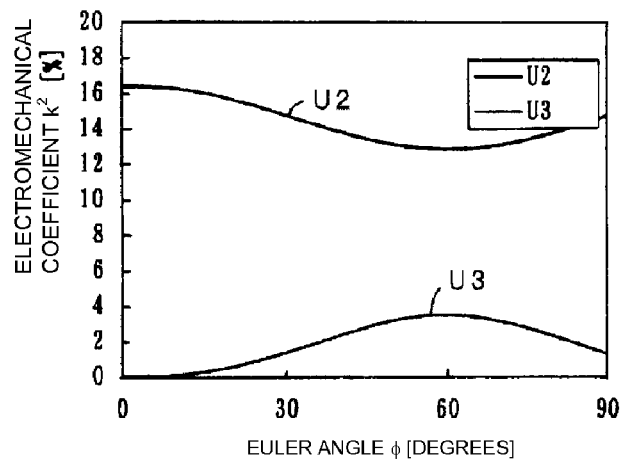
FIG. 16 is a graph showing the relationship between φ of the Euler angles and an electromechanical coefficient $k^2$, which is obtained in Experimental Example 3 in which a LiNbO₃ substrate with Euler angles (φ, 105°, 0°) is used.
Figure 17:
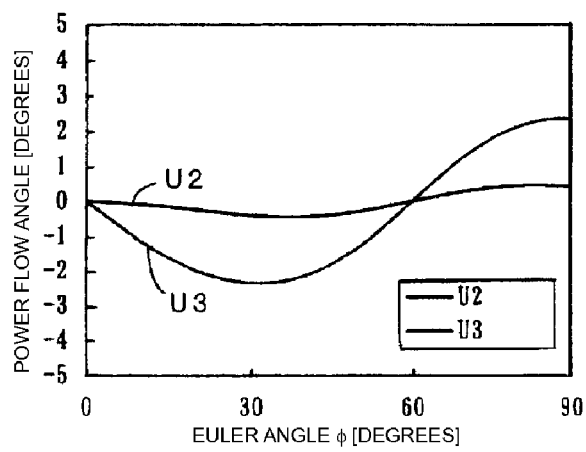
FIG. 17 is a graph showing the relationship between φ of the Euler angles and a power flow angle, which is obtained in Experimental Example 3 in which a LiNbO₃ substrate with Euler angles (φ, 105°, 0°) is used.
Figure 18:
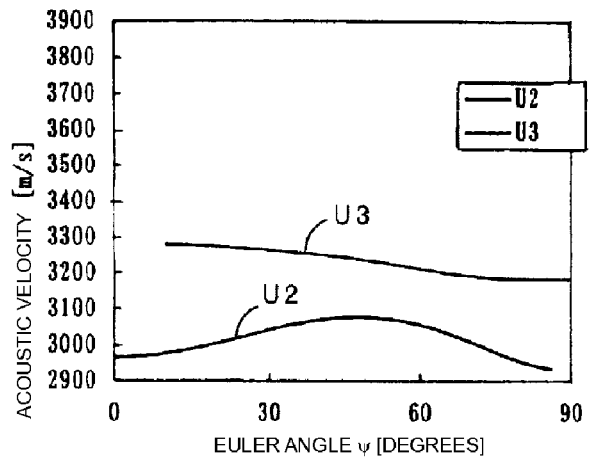
FIG. 18 is a graph showing the relationships of ψ of the Euler angles with an acoustic velocity V of an SH type boundary acoustic wave and that of a Stoneley wave, which are obtained in Experimental Example 3 in which a LiNbO₃ substrate with Euler angles (0°, 105°, ψ) is used.
Figure 19:
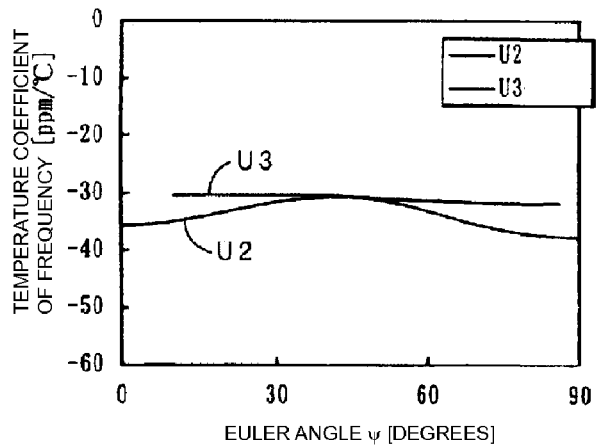
FIG. 19 is a graph showing the relationship between ψ of the Euler angles and a temperature coefficient of frequency TCF, which is obtained in Experimental Example 3 in which a LiNbO₃ substrate with Euler angles (0°, 105°, ψ) is used.

As apparent from FIG. 16, the electromechanical coefficient $k^2$ of the Stoneley wave is small, such as about 1.5% or less, in the range of φ of 0° to 31°; the electromechanical coefficient $k^2$ of the Stoneley wave is further decreased to about 1.0% or less in the range of φ of 0° to 26°; the electromechanical coefficient $k^2$ of the Stoneley wave is decreased to about 0.5% or less in the range of φ of 0° to 19°; and the electromechanical coefficient $k^2$ of the Stoneley wave becomes approximately 0% at φ of 0°, so that it is understood that a spurious response caused by the Stoneley wave is decreased. In addition, in the range of φ of 0° to 90°, the TCF of the SH type boundary acoustic wave is preferably in the range of −37 ppm/° C. to −35 ppm/° C.

In both cases in which the Euler angles are (φ, 105°, 0°) and Euler angles are (−φ, 105°, 0°), it is confirmed that results equivalent to each other can be obtained.

Figure 20:
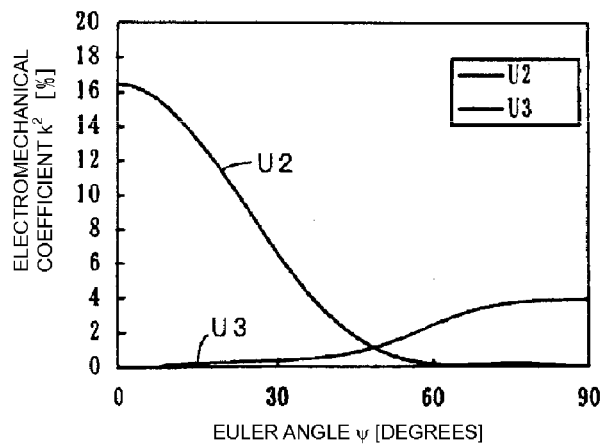
FIG. 20 is a graph showing the relationship between ψ of the Euler angles and an electromechanical coefficient $k^2$, which is obtained in Experimental Example 3 in which a LiNbO₃ substrate with Euler angles (0°, 105°, ψ) is used.
Figure 21:
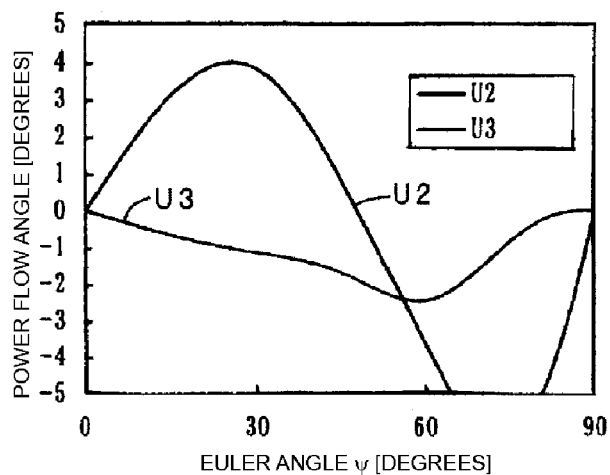
FIG. 21 is a graph showing the relationship between ψ of the Euler angles and a power flow angle, which is obtained in Experimental Example 3 in which a LiNbO₃ substrate with Euler angles (0°, 105°, ψ) is used.

In addition, as apparent from FIG. 20, the electromechanical coefficient $k^2$ of the Stoneley wave is small, such as 1.5% or less, in the range of ψ of 0° to 53°; the electromechanical coefficient $k^2$ of the Stoneley wave is decreased to 1.0% or less in the range of ψ of 0° to 47°; and the electromechanical coefficient $k^2$ of the Stoneley wave in the range of ψ of 0° to 38° is further decreased to about 0.5% or less. At ψ of 0°, the electromechanical coefficient of the Stoneley wave is decreased to approximately 0%, and it is understood that a spurious response caused by the Stoneley wave is decreased.

In addition, in the range of ψ of 0° to 90°, the TCF of the SH type boundary acoustic wave is preferably in the range of −35 ppm/° C. to −31 ppm/° C.

It is confirmed that in both cases in which the Euler angles are (0°, 105°, ψ) and (0°, 105°, −ψ), for example, a plus or a minus sign of the power flow angle is merely reversed, and properties equivalent to each other can be obtained.

Experimental Example 4

Incidentally, in general, it has been known that the pass band width of a longitudinally coupled resonator filter in which a plurality of IDTs is disposed between reflectors and the pass band width of a ladder filter or a lattice filter in which resonators are connected to each other are each approximately proportional to the electromechanical coefficient $k^2$. In addition, it has also been known that the band width of a resonator, that is, the difference between a resonant frequency and an antiresonant frequency is approximately proportional to the electromechanical coefficient $k^2$. Hence, in the case in which an SH type boundary acoustic wave is used, when the electromechanical coefficient $K^2$ of a Stoneley wave is small, and when the electromechanical coefficient $K^2$ of the SH type boundary acoustic wave can be changed under the conditions in which a spurious response caused by the Stoneley wave is small, it is understood that the band width can be easily adjusted. That is, the degree of freedom for designing a filter and a resonator can be increased.

As shown in FIG. 20, when ψ of the Euler angle is changed from 0° to 60°, the electromechanical coefficient $k^2$ of the SH type boundary acoustic wave is changed from 16.4% to 0.1%. In the above-described region, the electromechanical coefficient $k^2$ of the Stoneley wave is small. Furthermore, φ and θ of the Euler angles are angles determining a cut surface of a substrate which propagates a boundary acoustic wave, and ψ of the Euler angle is an angle determining the propagation direction of the boundary acoustic wave. Hence, as shown in FIG. 1A, when the first and the second boundary acoustic wave elements are disposed on the substrate having the same cut surface so that the propagation directions X1 and X2 are different from each other, the conditions can be obtained in which the electromechanical coefficients $k^2$ are different from each other.

That is, in the boundary acoustic wave device 1 shown in FIG. 1, although the first and the second boundary acoustic wave elements 2 and 3 are formed from the single crystal substrate 4 made of the same piezoelectric crystal, since the propagation directions X1 and X2 of the boundary acoustic wave are different from each other, the electromechanical coefficients $k^2$ are made different from each other. Hence, a single crystal substrate having a different cut surface is not necessarily prepared in accordance with a required band width, and various band widths can be realized using the same single crystal substrate. The Euler angles of the single crystal substrate 4 are not limited to Euler angles (0°, 105°, ψ), and φ and θ of the Euler angles may be changed. The Euler angles described in Experimental Examples 2 and 3 are preferably used since the electromechanical coefficient $k^2$ of the SH type boundary acoustic wave can be sufficiently increased, and the electromechanical coefficient $k^2$ of the Stoneley wave which causes a spurious signal can be decreased.

Experimental Example 5

Figure 22:
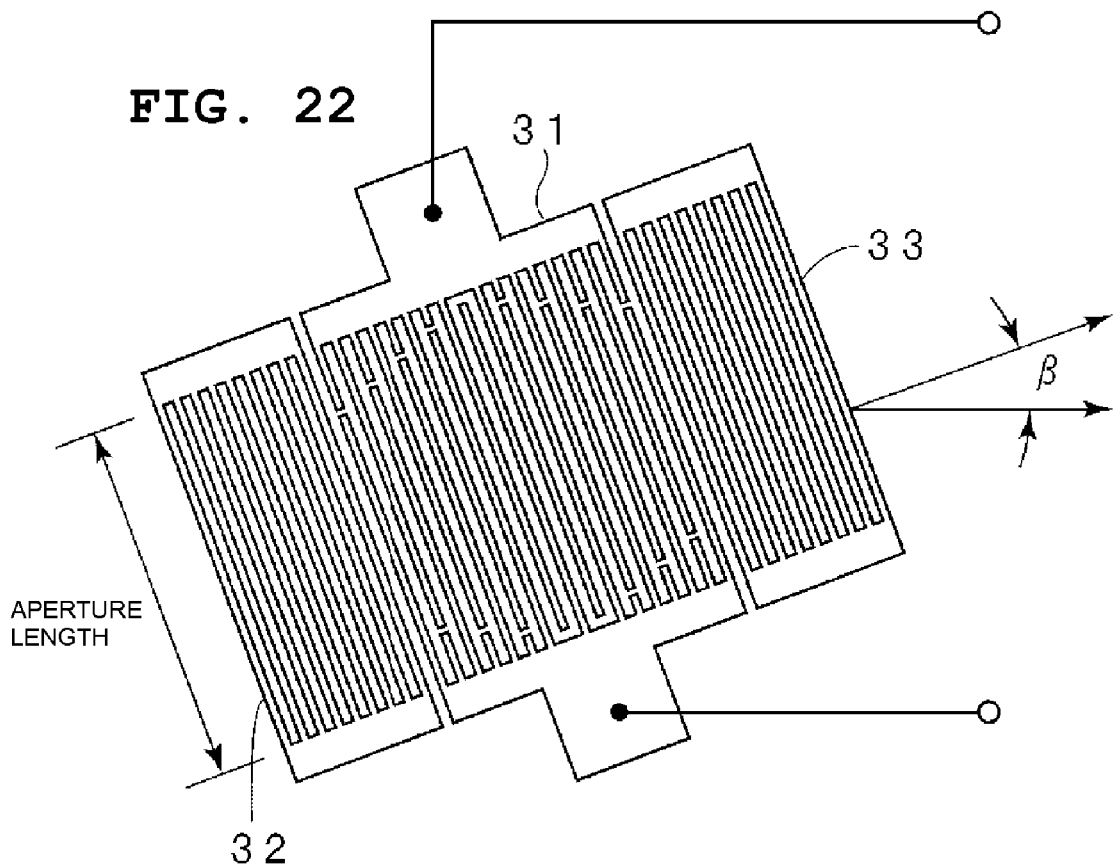
FIG. 22 is a schematic plan view for illustrating an electrode structure of a boundary acoustic wave resonator prepared in Experimental Example 5.

A NiCr film having a thickness of about 0.001 λ was formed as an adhesion layer on a single crystal substrate of a LiNbO₃ substrate with Euler angles (φ, 105°, 0°) by a deposition method. Subsequently, after a film was formed from Au by deposition on the NiCr film, an electrode structure shown in FIG. 22 was formed by a photolithographic lift-off method.

In this electrode structure, there are provided interdigital electrodes 31 and reflectors 32 and 33 disposed at two sides of the interdigital electrodes 31 along the propagation direction of a boundary acoustic wave.

The interdigital electrodes 31 and the reflectors 32 and 33 were disposed to incline the directions of electrode fingers thereof, so that a propagation direction β of the boundary acoustic wave was changed in the range of −50° to 50°.

In addition, a SiO₂ film having a thickness of λ was formed by RF magnetron sputtering so as to cover the interdigital electrodes 31 and the reflectors 32 and 33. The temperature for film formation was 250° C.

In the interdigital electrodes 31, the number of pairs of electrode fingers was 50.5, and weighting of intersection-width was performed as shown in the figure so as to minimize transverse mode spuriousness. In addition, the number of electrode fingers of each of the reflectors 32 and 33 was 51. In addition, the aperture length was 30 λ. In this example, λ was a placement period of strips of the interdigital electrodes 31 and the reflectors 32 and 33 and was 3.0 µm.

The duty ratio of the interdigital electrodes 31 and the reflectors 32 and 33 was 0.58, the thickness of the Au film was 0.05 λ, and the thickness of the SiO₂ film was λ.

Impedance-frequency characteristics and phase characteristics of the boundary acoustic wave device formed as described above are shown in FIGS. 23A to 23C and FIGS. 24A to 24C. In FIGS. 23A to 24C, the impedance on the vertical axis is a value represented by the following equation (8).

$$F(\phi, \theta, \psi) = F(60° - \phi, -\theta, \psi)$$
$$= F(60° + \phi, -\theta, 180° - \psi)$$
$$= F(\phi, 180° + \theta, 180° - \psi)$$
$$= F(\phi, \theta, 180° + \psi)$$

Equation (8)

In FIG. 23C and FIGS. 24A to 24C, a spurious signal generated at around 1,100 MHz to 1,130 MHz is a spurious signal caused by the Stoneley wave. When φ of the Euler angles is 20° or more, a spurious signal caused by the Stoneley wave is slightly generated. However, as shown in Experimental Example 2, when θ of the Euler angles is 106°, the spurious signal caused by the Stoneley wave can be effectively minimized.

In addition, in the characteristics shown in FIG. 23C and FIGS. 24A to 24C, although a spurious signal caused by the Stoneley wave is generated, the degree thereof is sufficiently small, and as a result, no practical problem occurs.

FIGS. 25A to 28C are graphs each showing the relationship between ψ of the Euler angles and the resonant-antiresonant difference which is obtained by dividing the difference between a resonant frequency and an antiresonant frequency of the above one-port type boundary acoustic wave resonator by the resonant frequency. The Euler angle θ is 90° in FIGS. 25A to 25C, θ is 100° in FIGS. 26A to 26C, θ is 105° in FIGS. 27A to 27C, and θ is 110° in FIGS. 28A to 28C.

In addition, FIGS. 29A to 32C are graphs showing the relationships between ψ of the Euler angles and the impedance, which are obtained when θ of the Euler angles is 95°, 100°, 105°, and 110°.

Figure 23A:
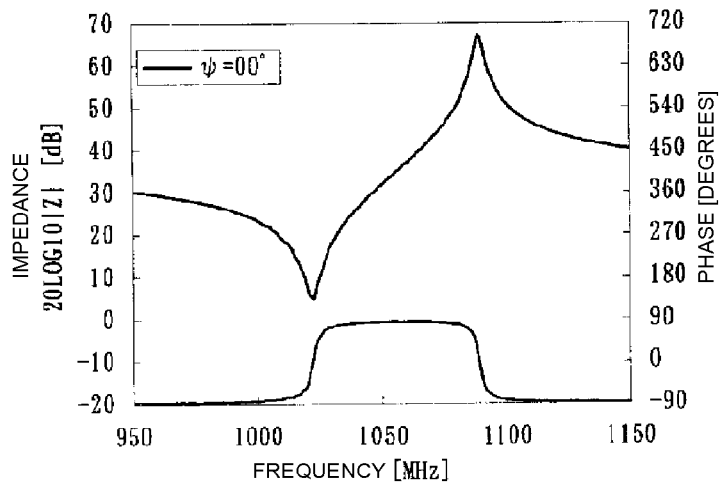
FIGS. 23A to 23C are graphs showing impedance-frequency characteristics and phase-frequency characteristics, which are obtained when the propagation directions are inclined so that ψ of the Euler angles of a crystal substrate of a one-port type boundary acoustic wave resonator prepared in Experimental Example 5 is 0°, 10°, and 20°.
Figure 23B:
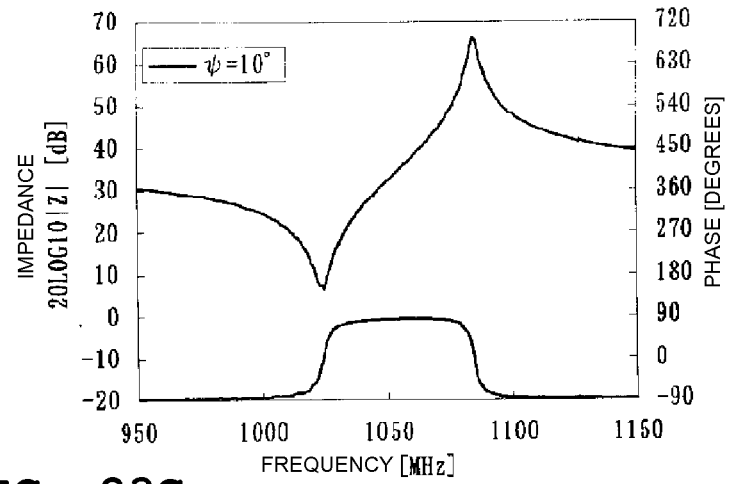
Figure 23C:
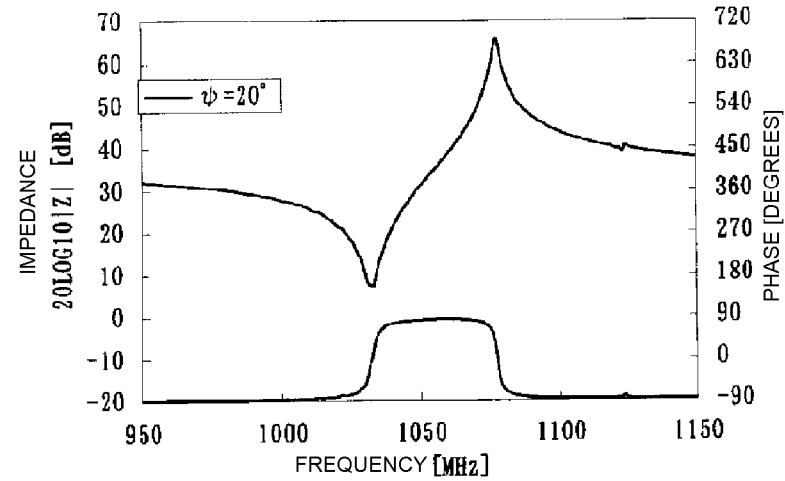
Figure 24A:
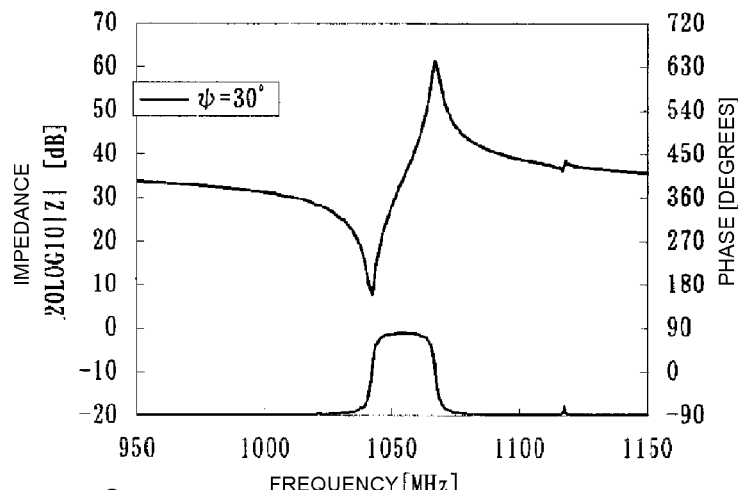
FIGS. 24A to 24C are graphs showing impedance-frequency characteristics and phase-frequency characteristics, which are obtained when the propagation directions are inclined so that ψ of the Euler angles of a crystal substrate of the one-port type boundary acoustic wave resonator prepared in Experimental Example 5 is 30°, 40°, and 50°.
Figure 24B:
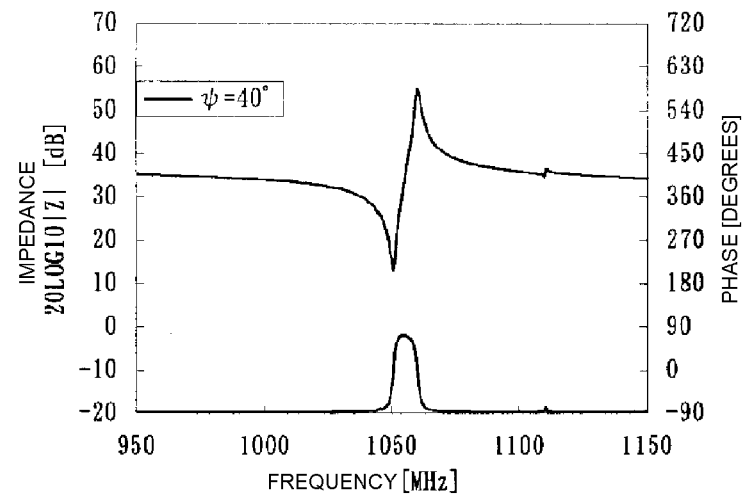
Figure 24C:
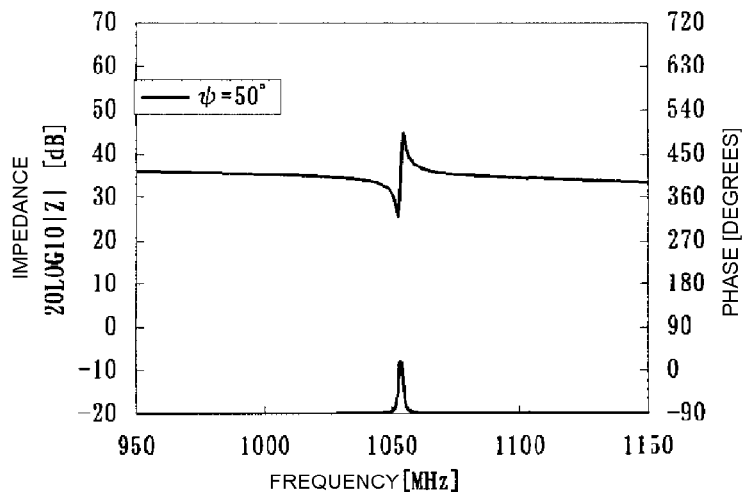
Figure 25A:
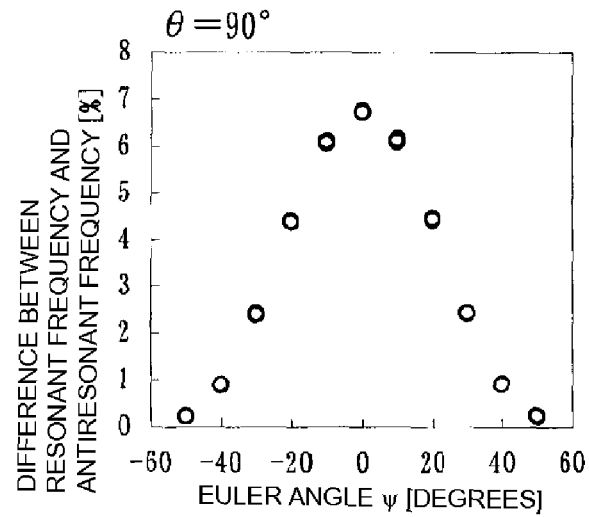
FIGS. 25A to 25C are graphs showing the relationships of ψ of the Euler angles with the difference between the resonant and antiresonant frequencies, which are obtained when the thickness H/λ of electrodes which are made of Au and which are provided on a LiNbO₃ substrate with Euler angles (0°, 95°, ψ) is 0.04, 0.05 and 0.06.
Figure 25B:
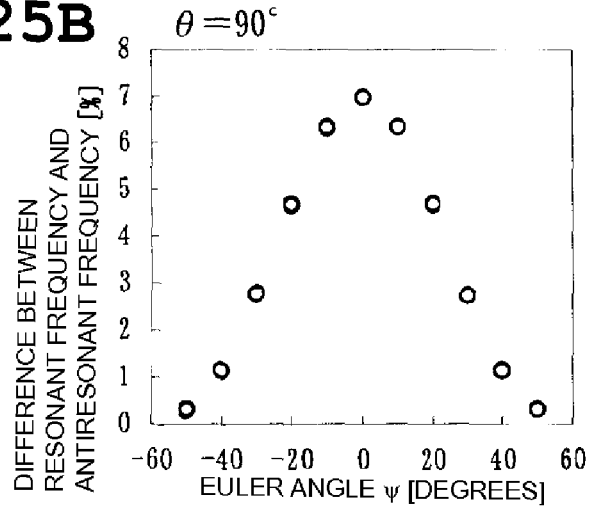
Figure 25C:
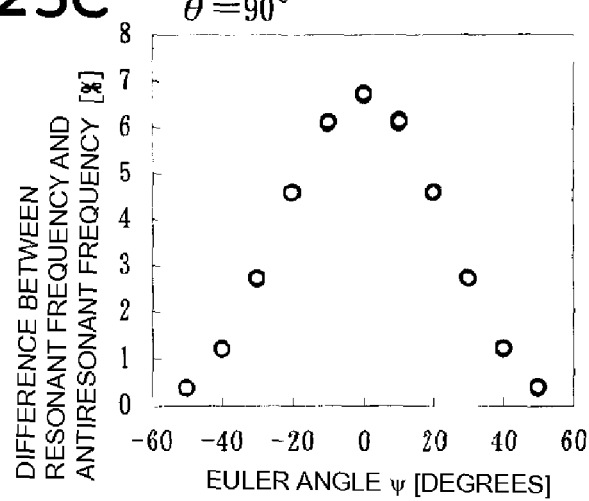
Figure 26A:
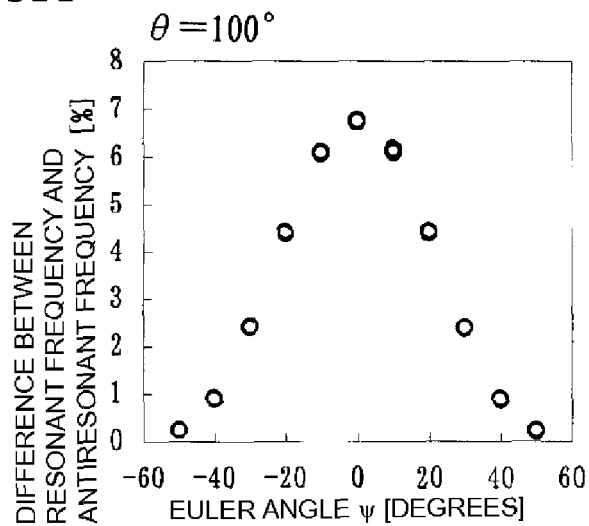
FIGS. 26A to 26C are graphs showing the relationships of ψ of the Euler angles with the difference between the resonant and antiresonant frequencies, which are obtained when the thickness H/λ of electrodes which are made of Au and which are provided on a LiNbO₃ substrate with Euler angles (0°, 100°, ψ) is 0.04, 0.05 and 0.06.
Figure 26B:
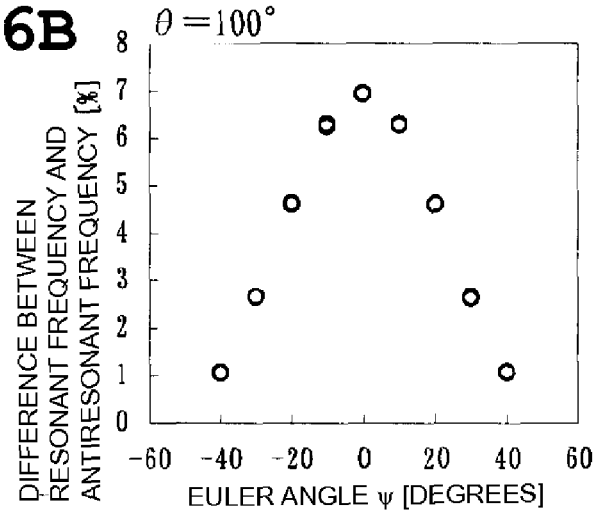
Figure 26C:
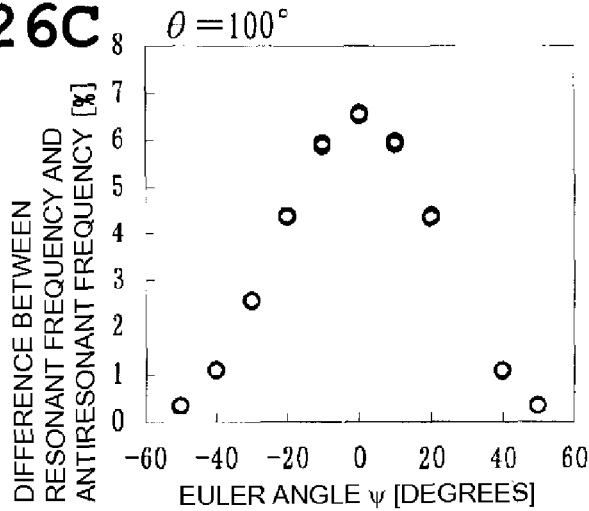
Figure 27A:
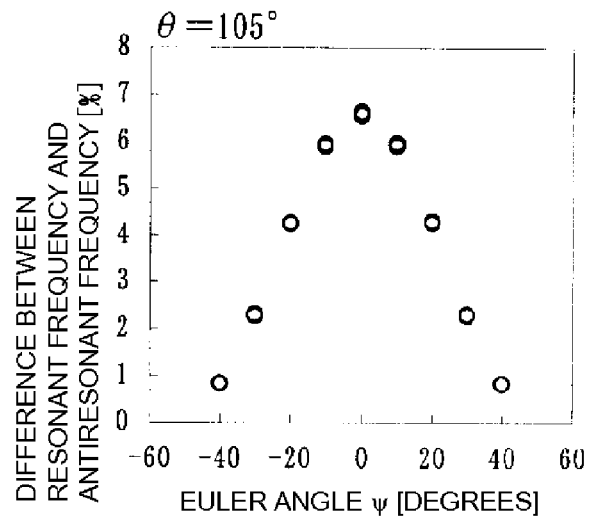
FIGS. 27A to 27C are graphs showing the relationships of ψ of the Euler angles with the difference between the resonant and antiresonant frequencies, which are obtained when the thickness H/λ of electrodes which are made of Au and which are provided on a LiNbO₃ substrate with Euler angles (0°, 105°, ψ) is 0.04, 0.05 and 0.06.
Figure 27B:
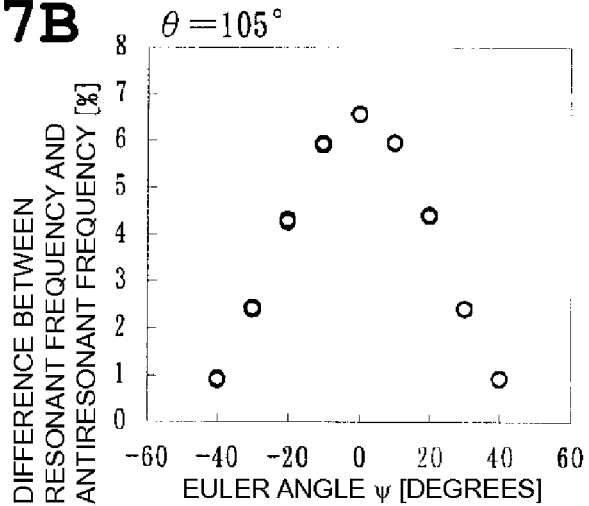
Figure 27C:
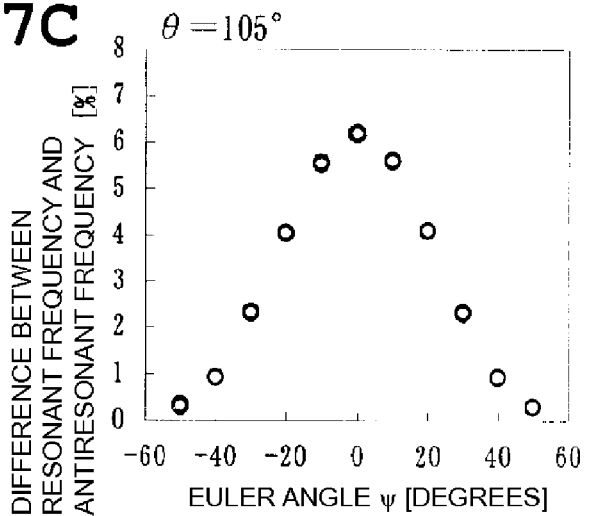
Figure 28A:
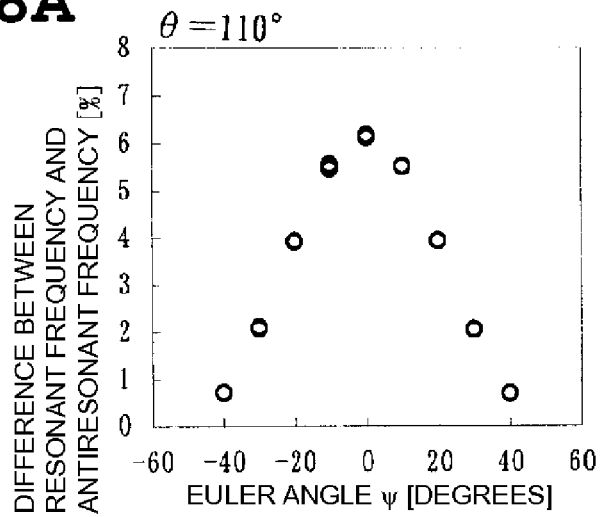
FIGS. 28A to 28C are graphs showing the relationships of ψ of the Euler angles with the difference between the resonant and antiresonant frequencies, which are obtained when the thickness H/λ of electrodes which are made of Au and which are provided on a LiNbO₃ substrate with Euler angles (0°, 110°, ψ) is 0.04, 0.05 and 0.06.
Figure 28B:
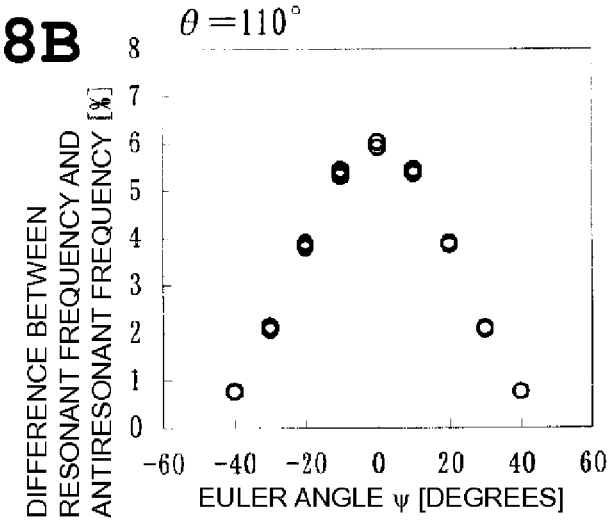
Figure 28C:
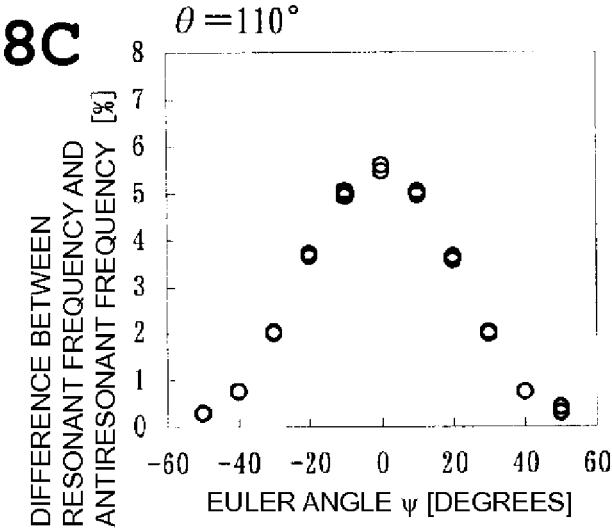
Figure 29A:
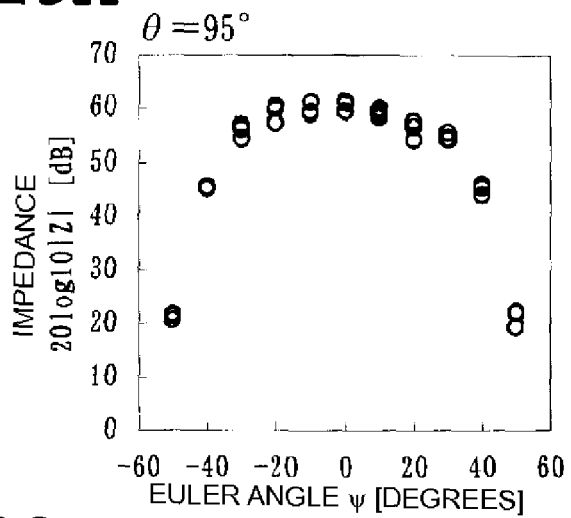
FIGS. 29A to 29C are graphs showing the relationships between ψ of the Euler angles and the impedance, which are obtained when the thickness H/λ of electrodes which are made of Au and which are provided on a LiNbO₃ substrate with Euler angles (0°, 95°, ψ) is 0.04, 0.05 and 0.06.
Figure 29B:
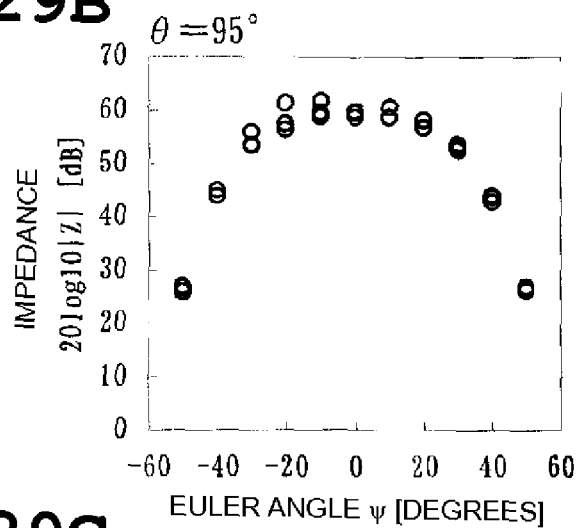
Figure 29C:
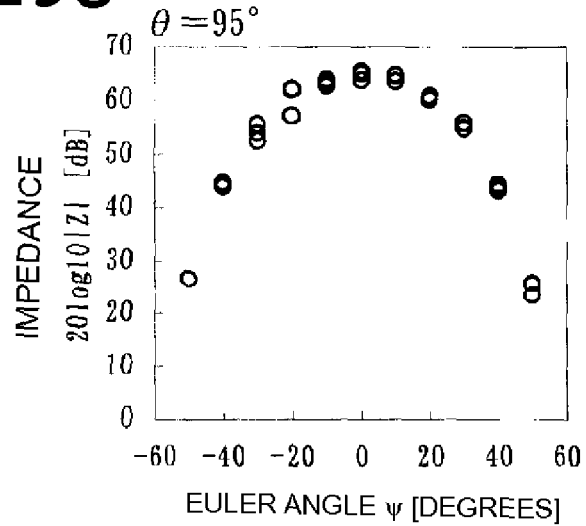
Figure 30A:
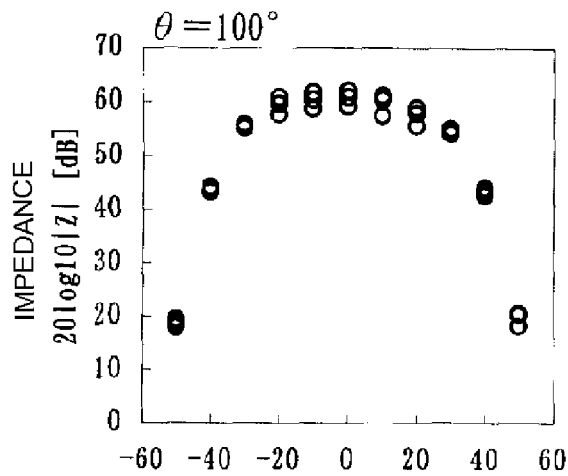
FIGS. 30A to 30C are graphs showing the relationships between ψ of the Euler angles and the impedance, which are obtained when the thickness H/λ of electrodes which are made of Au and which are provided on a LiNbO₃ substrate with Euler angles (0°, 100°, ψ) is 0.04, 0.05 and 0.06.
Figure 30B:
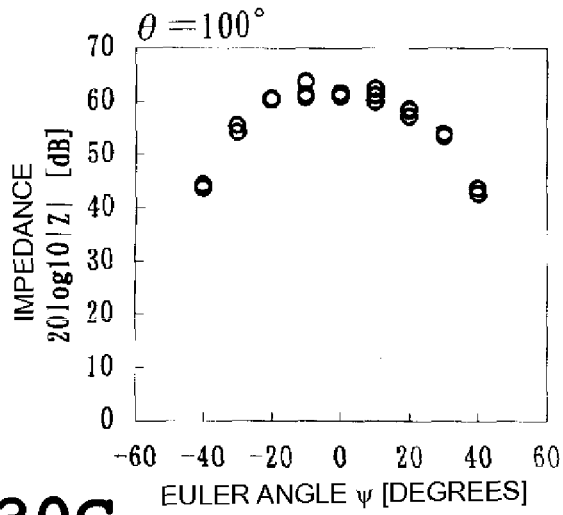
Figure 30C:
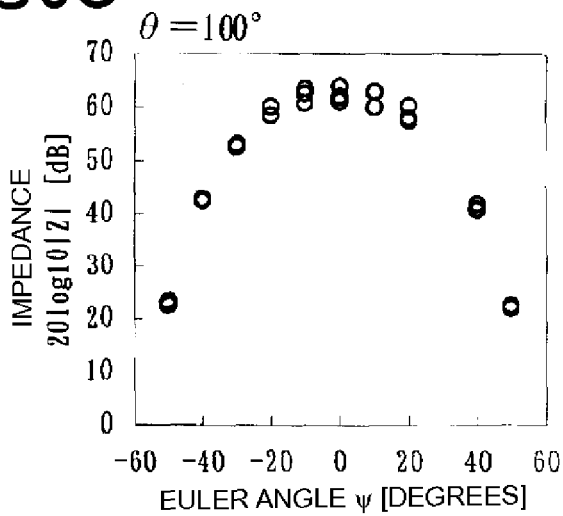
Figure 31A:
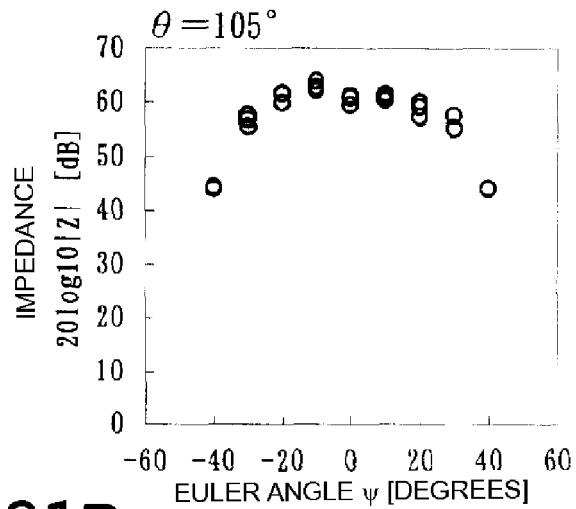
FIGS. 31A to 31C are graphs showing the relationships between ψ of the Euler angles and the impedance, which are obtained when the thickness H/λ of electrodes which are made of Au and which are provided on a LiNbO₃ substrate with Euler angles (0°, 105°, ψ) is 0.04, 0.05 and 0.06.
Figure 31B:
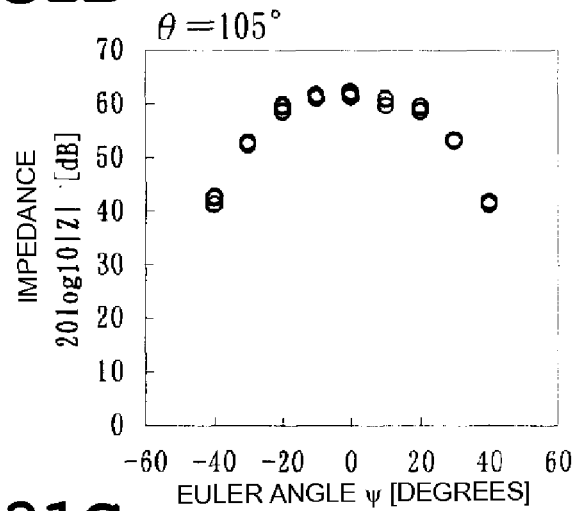
Figure 31C:
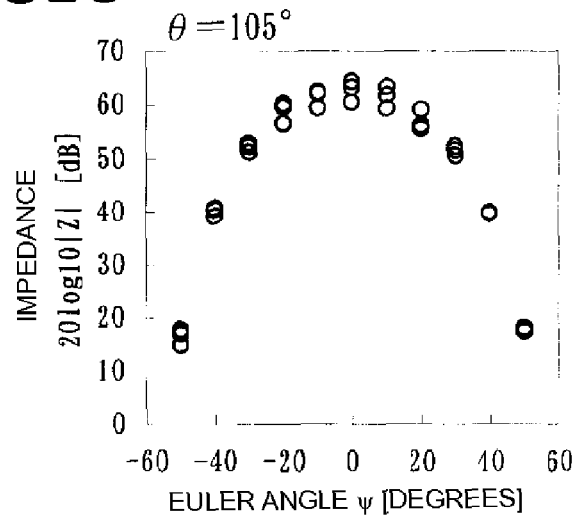
Figure 32A:
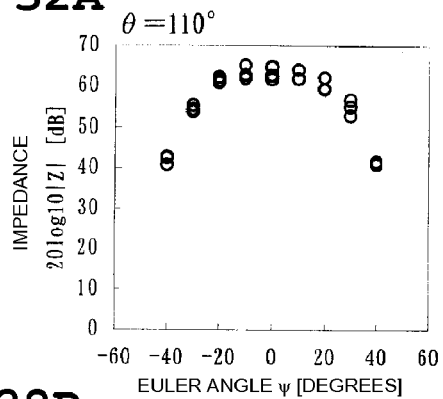
FIGS. 32A to 32C are graphs showing the relationships between ψ of the Euler angles and the impedance, which are obtained when the thickness H/λ of electrodes which are made of Au and which are provided on a LiNbO₃ substrate with Euler angles (0°, 110°, ψ) is 0.04, 0.05 and 0.06.
Figure 32B:
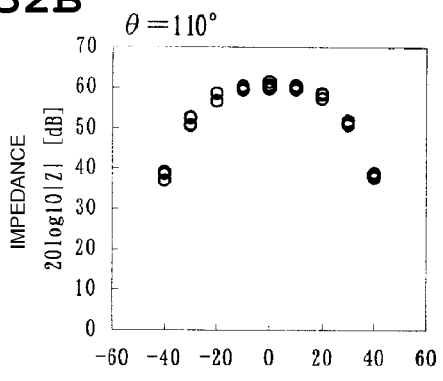
Figure 32C:
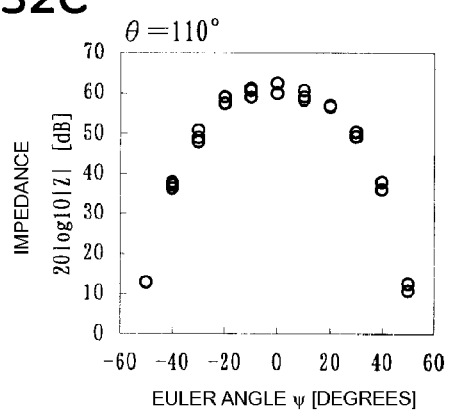

In this example, the impedance value is represented by Equation (8) as is the case shown in FIGS. 23A to 23C.

As can be seen from FIGS. 25A to 32C, it is understood that when ψ indicating the propagation direction is changed, the band width can be adjusted.

In FIGS. 25A to 32C, the electrode thickness is 0.04 λ to 0.06 λ, the Euler angle θ is 95 to 110°, and the duty ratio is 0.636.

Experimental Example 6

Figure 33:
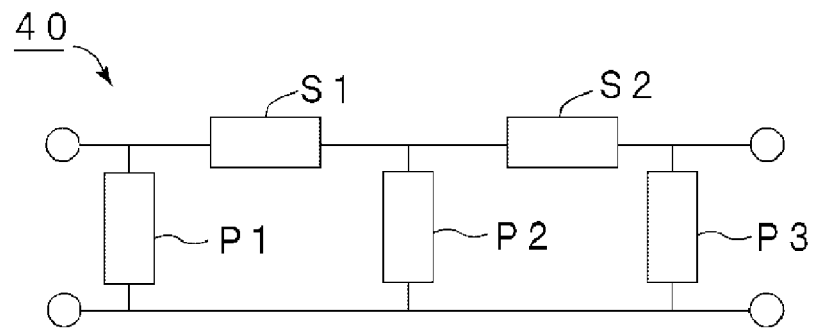
FIG. 33 is a view showing a circuit diagram of a ladder filter prepared in Experimental Example 5.
Figure 34A:
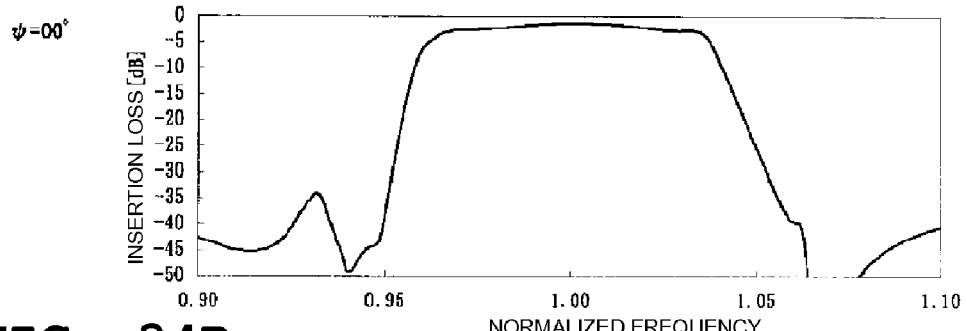
FIGS. 34A and 34B are graphs each showing pass characteristics obtained when ν of the Euler angles of a ladder filter prepared in Experimental Example 6 is 0° and 10°.
Figure 34B:
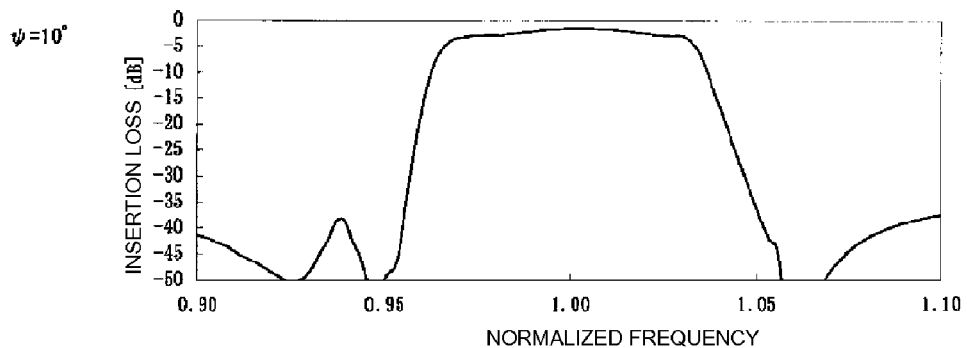
Figure 35A:
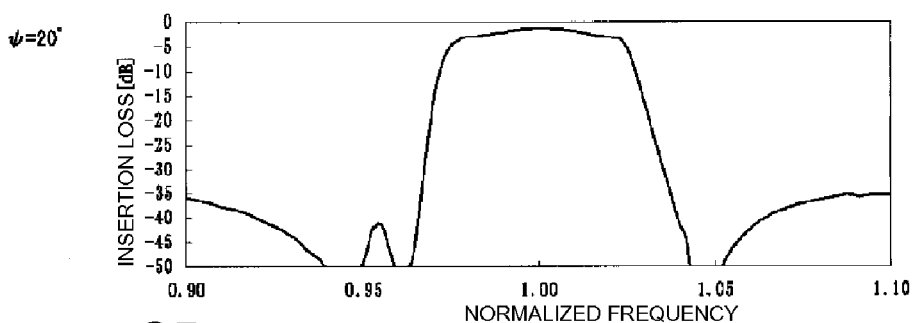
FIGS. 35A and 35B are graphs each showing pass characteristics obtained when ν of the Euler angles of a ladder filter prepared in Experimental Example 6 is 20° and 30°.
Figure 35B:
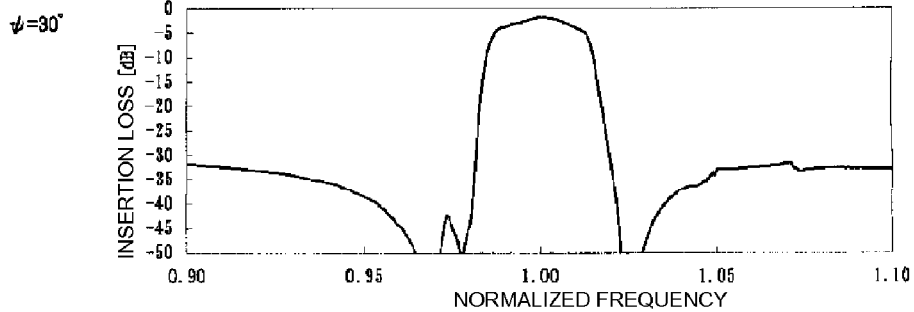

In accordance with the method in Experimental Example 5, 7 one-port type boundary acoustic wave resonators were formed, and as shown in FIG. 33, a ladder filter was formed in which 5 boundary acoustic wave resonators were connected to form a ladder structure. In FIG. 33, a ladder filter 40 has series arm resonators S1 and S2 on a series arm connecting an input terminal and an output terminal. In addition, between the series arm and a reference potential, 3 parallel arm resonators P1 to P3 are provided.

In this experimental example, on the same single crystal substrate, 5 boundary acoustic wave resonators were formed. The single crystal substrate used in this example was a LiNbO$_3$ substrate with Euler angles (0°, 105°, 0° to 140°).

In each one-port type boundary acoustic wave resonator, the number of electrode fingers of each reflector was 51. In the parallel arm resonators P1 and P3, the number of pairs of electrode fingers of interdigital electrodes was 50.5, and the aperture length was 30 λ. The series arm resonators S1 and S2 were formed by connecting 2 resonators in series which were the same as that used for forming the parallel arm resonators P1 and P3. As for the parallel arm resonator P2, the number of pairs of electrode fingers of interdigital electrodes was 100.5, and the aperture length was 30 λ. As for the parallel arm resonators P1 to P3, the wavelength λ of the interdigital electrodes and the reflectors was 3.0 λ. In addition, the series arm resonators S1 and S2 was set so that the antiresonant frequency of the parallel arm resonators P1 and P3 and the resonant frequency of the series arm resonators S1 and S2 were approximately overlapped with each other. The duty ratio of the interdigital electrodes and that of the reflectors were both 0.58, the electrode thickness of Au was 0.05 λ, and the thickness of the SiO$_2$ film was 2.5 λ.

The frequency characteristics of the ladder filter obtained when the Euler angle ψ was changed to 0°, 20°, and 30° are shown in FIGS. 34A to 35B.

In FIGS. 34A to 35B, the horizontal axis indicates a normalized frequency obtained by dividing the frequency by a 3-dB band width of each filter. The 3-dB center frequency is approximately 1,080 MHz.

As apparent from FIGS. 34A to 35B, it is understood that when the Euler angle ψ is changed, the band width can be adjusted. In addition, when the normalized frequency is in the range of 1.05 to 1.10, a spurious signal is generated; however, since a spurious signal caused by the Stoneley wave is sufficiently minimized, no practical problems occur at all. In addition, the minimum insertion loss at ψ of zero was superior, such as 1.27 dB.

Figure 37:
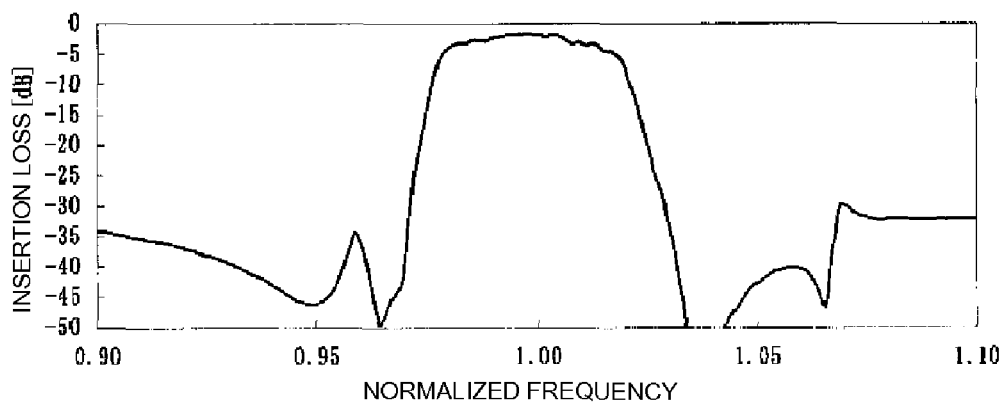
FIG. 37 is a graph showing pass characteristics of a ladder filter prepared in Experimental Example 6 in which an electrode material is changed to Cu.

Next, electrodes were formed from Cu, and a ladder filter was formed in a manner equivalent to that described above. In this case, the electrode thickness of the interdigital electrodes and that of the reflectors were 0.10 λ, and the duty ratio was 0.6. As the piezoelectric single crystal substrate, a LiNbO$_3$ substrate with Euler angles (0°, 110°, 0°) was used. In addition, under the electrodes made of Cu, as an adhesion layer, a Ti film having a thickness of 0.003 λ was formed as a sub-electrode layer. Furthermore, on the electrode layer primarily composed of Cu, a third electrode layer made of Al having a thickness of 0.003 λ was formed as a protective layer. The placement period λ of electrode fingers of the IDT and that of the reflector were 3 μm. In addition, the thickness of the SiO$_2$ film was 2 λ, and onto the solid layer made of the SiO$_2$ film, an epoxy resin was applied so as to have a thickness of 5 λ or more, followed by curing. The frequency characteristics of the ladder filter thus obtained are shown in FIG. 37. In FIG. 37, the minimum insertion loss was superior, such as 1.7 dB.

As apparent from FIG. 37, it is understood that even when the main electrode layer is formed from Cu, superior filter characteristics can be obtained.

The method described above which adjusts the band width by changing the electromechanical coefficient $k^2$ using the propagation direction of a boundary acoustic wave may be applied to a lattice filter formed by disposing a plurality of one-port type resonators, a longitudinally coupled resonator type filter formed by disposing a plurality of IDTs, a two-port type resonator, and a laterally coupled filter in addition to the above one-port type resonator and the ladder filter using a plurality of one-port type resonators.

Experimental Example 7

Figure 38A:
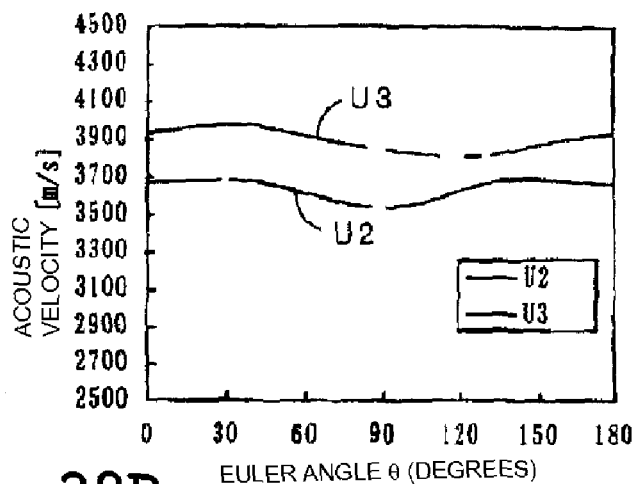
FIGS. 38A to 38C are graphs showing the relationships of θ of the Euler angles with an acoustic velocity V, an electromechanical coefficient $k^2$, and a temperature coefficient of frequency in the structure in which Au electrodes are provided on a $LiNbO_3$ substrate of (0°, θ, 0°) and in which a polycrystalline Si layer is provided.
Figure 38B:
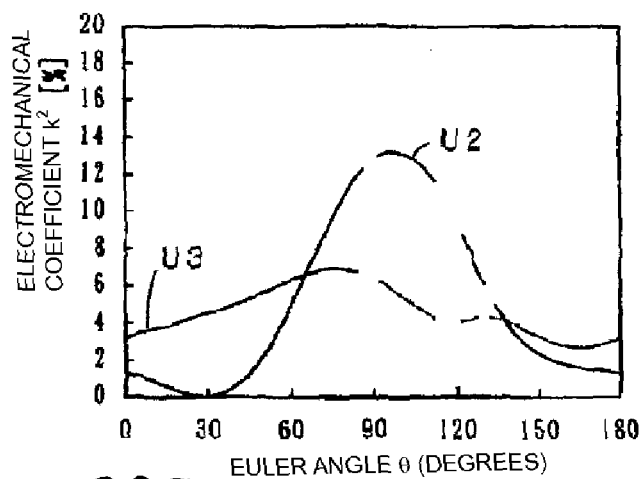
Figure 38C:
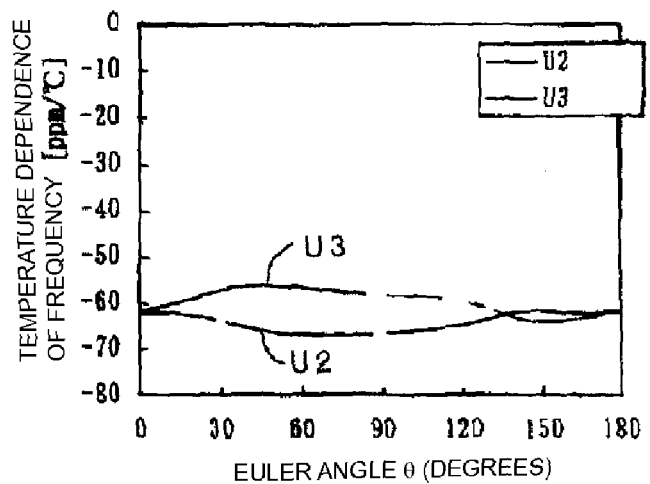

After electrodes made of Au having a thickness of 0.5 λ were formed on a LiNbO$_3$ substrate with Euler angles (0°, θ, 0°), polycrystalline Si having an infinite thickness was formed as the solid layer on the above electrodes made of Au in one case, and SiO$_2$ having a thickness of 0.1 λ and polycrystalline Si having an infinite thickness were formed as the solid layer on the above-described electrodes made of Au in the other case. Subsequently, the relationships of the Euler angle θ with the acoustic velocities V, electromechanical coefficients $k^2$ propagation losses α, and temperature coefficients of frequency TCF (PFA) of an SH type boundary acoustic wave (U2) and a Stoneley wave (U3) were measured. FIGS. 38A to 38C show the results obtained when the polycrystalline Si having an infinite thickness was formed, and FIGS. 39A to 39C show the results obtained when the SiO$_2$ having a thickness of 0.1 λ and the polycrystalline Si having an infinite thickness were formed.

In the entire region of θ from 0° to 180°, the propagation loss α was 0 dB/k and the power flow angle PFA was 0°.

Figure 39A:
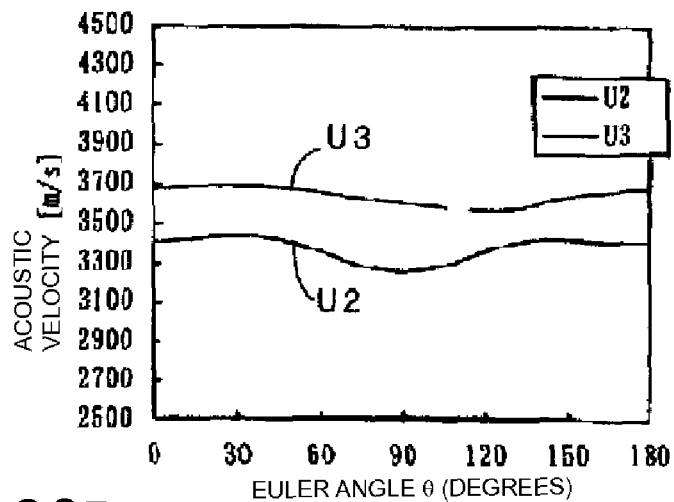
FIGS. 39A to 39C are graphs showing the relationships of θ of the Euler angles with an acoustic velocity V, an electromechanical coefficient $k^2$, and a temperature coefficient of frequency in the structure in which Au electrodes are provided on a $LiNbO_3$ substrate of (0°, θ, 0°) and in which a $SiO_2$ film and polycrystalline Si are provided.
Figure 39B:
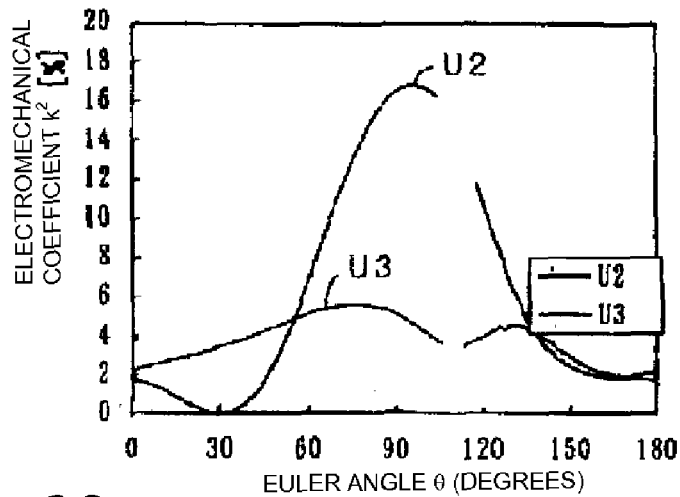
Figure 39C:
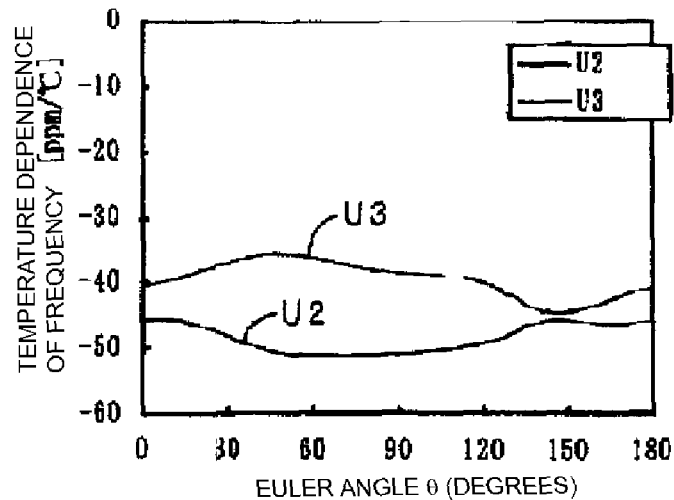

As apparent from the comparison between the results shown in FIGS. 38A to 38C and those shown in FIGS. 39A to 39C, it is understood that compared to the case in which the SiO$_2$ solid layer is used, when the polycrystalline Si is used, although the electromechanical coefficient $k^2$ of the Stoneley wave cannot be decreased to zero in the case in which the SH type boundary acoustic wave is used, the electromechanical coefficient of the Stoneley wave tends to decrease at an Euler angle θ of 106° to 115°. Hence, it is understood that even in the case in which the solid layer is formed from polycrystalline Si, a spurious signal caused by the Stoneley wave can be minimized at the same Euler angle as that in the case in which the solid layer is formed from SiO$_2$.

Experimental Example 8

An RF module for mobile phones has a transmitting block and a receiving block, and a transmitting band and a receiving band are different from each other. In an Rx filter used in the receiving block, the receiving band is a pass band, and the transmitting band is a stop band. In addition, in a Tx filter used in the transmitting block, the transmitting band is a pass band, and the receiving band is a stop band.

Accordingly, in the RF filter used for mobile phones, it may be strongly required in some cases that with respect to the pass band, the amount of attenuation in the stop band, which is at one side of the pass band, is sufficiently large. In this case, it has been known that asymmetric pass characteristics of the filter have to be intentionally formed so that the amount of attenuation in the receiving band is sufficiently increased in the case of the Tx filter and so that on the other hand, the amount of attenuation in the transmitting band is sufficiently increased in the case of the RF filter.

In order to form the asymmetric pass characteristics of a filter, a coil or a capacitor may be connected to the filter. For example, in the case of a ladder filter, when a coil is connected to one of a parallel arm resonator and a series arm resonator so as to increase the difference between the resonant and the antiresonant frequencies of the above-described one resonator, the pass band can be made asymmetric. However, since a coil or a capacitor must be connected to the filter, the number of parts is increased, and in addition, the exterior dimension of the filter is inevitably increased.

Figure 36:
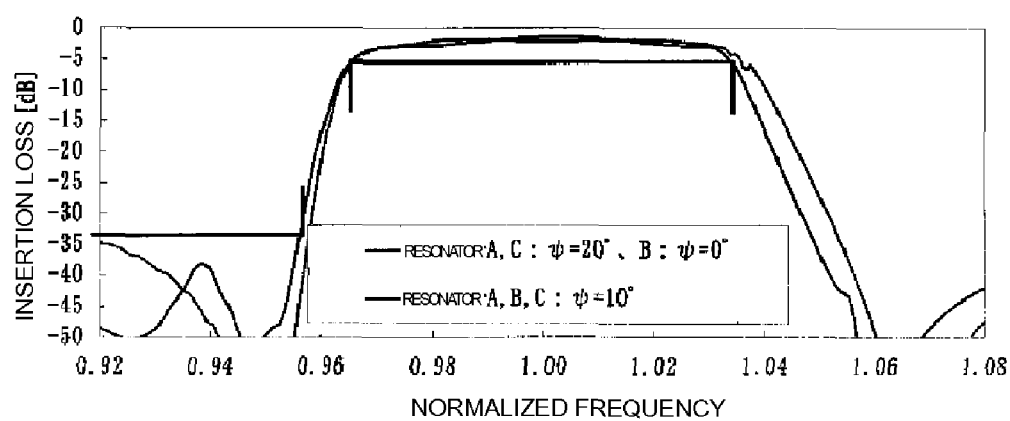
FIG. 36 is a graph showing pass characteristics of a ladder filter prepared in Experimental Example 8.

On the other hand, in preferred embodiments of the present invention, when a resonator is used in which the band is preferably adjusted by changing the propagation direction $\psi$ as described in Experimental Example 5, the above-described problem can be solved. In FIG. 36, the pass band of a ladder filter is shown which was formed in a manner equivalent to that for the ladder filter shown in FIG. 33 except that the propagation directions of the parallel arm resonators P1 and P3 were set so that $\psi=20°$ was satisfied, and the propagation directions of the series arm resonators S1 and S2 were set so that $\psi=0°$ was satisfied.

As apparent from FIG. 36, it is understood that at a low frequency side of the pass band, the attenuation rapidly occurs, and that at a normalized frequency of 0.956, although the amount of attenuation was merely 34 dB according to the pass characteristics of the ladder filter shown in FIGS. 34A to 35B, the amount of attenuation is large, such as 44 dB, according to the characteristics shown in FIG. 36.

In addition, when the propagation directions of the parallel arm resonators P1 and P3 and the propagation directions of the series arm resonators S1 and S2 are reversed therebetween, the amount of attenuation at a broadband side of the pass band can be improved.

The Euler angles of the LiNbO$_3$ substrate at which the electromechanical coefficient $k^2$ can be adjusted by changing the propagation direction are, for example, at about (90°, 90°, 0°), and about (0°, 105°, 0°) as shown in Experimental Example 5. Hence, in a SiO$_2$/Au/LiNbO$_3$ structure, when the thickness of Au is 0.07 λ, and when the Euler angles of the LiNbO$_3$ substrate are changed from (90°, 90°, 0°) to (90°, 90°, 60°), the electromechanical coefficient can be adjusted from about 16.8% to about 0.8%.

Figure 40:
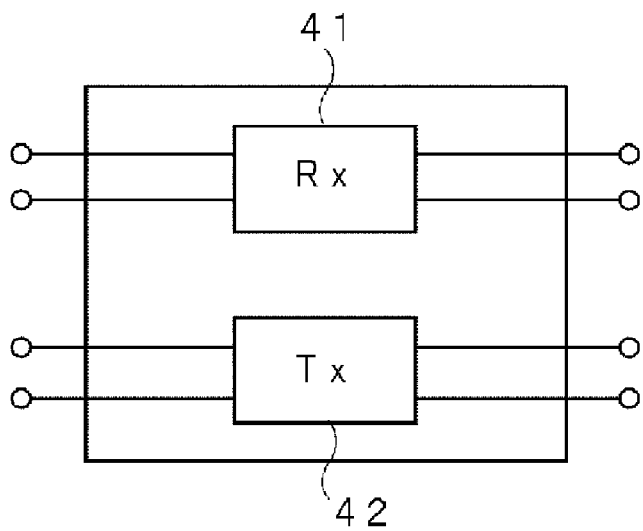
FIG. 40 is a schematic view of another example of a filter prepared in Experimental Example 8 to which a preferred embodiment of the present invention is applied.
Figure 41:
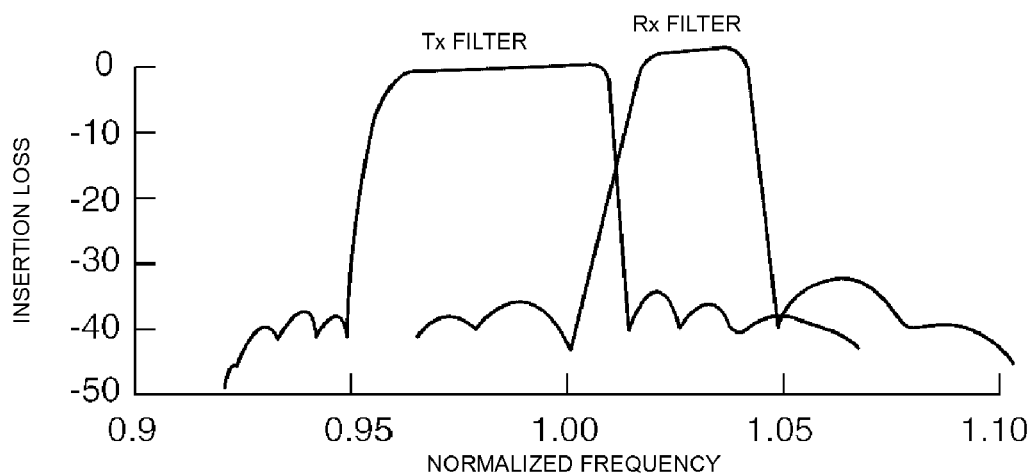
FIG. 41 is a graph showing frequency characteristics of an Rx filter and a Tx filter of the filter shown in FIG. 40.
Figure 42:
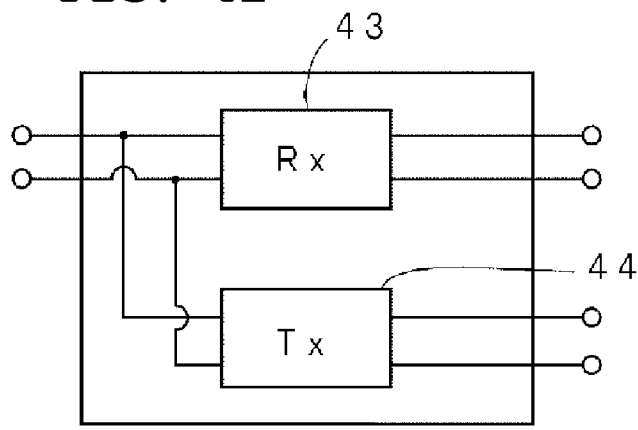
FIG. 42 is a block diagram for illustrating another example to which a preferred embodiment of the present invention is applied.

A method for improving performance of a boundary acoustic wave device using the structure in which the band width is adjusted by changing the electromechanical coefficient $k^2$ using the propagation direction may be applied to various structures besides the above-described ladder filter in which the steepness in the vicinity of the pass band is increased. For example, as shown in FIG. 40, the above method may be applied to a two-input and two-output filter chip having two bands in which an Rx filter 41 and a Tx filter 42 are provided to form one chip. In this case, the pass band of the Rx filter 41 and that of the Tx filter 42 are, for example, as shown in FIG. 41. In FIG. 41, a method equivalent to that described above may be performed, that is, for example, the steepness at a low frequency side of the pass band of the Rx filter may be increased, or the steepness at a high frequency side of the pass band of the Tx filter may be increased. In addition, as shown in FIG. 42, the above-described method may also be applied to a one-input and two-output filter having two bands in a manner equivalent to that described above. In the filter shown in FIG. 42, input of the Rx filter 43 and that of the Tx filter 44 are connected to each other.

Figure 43:
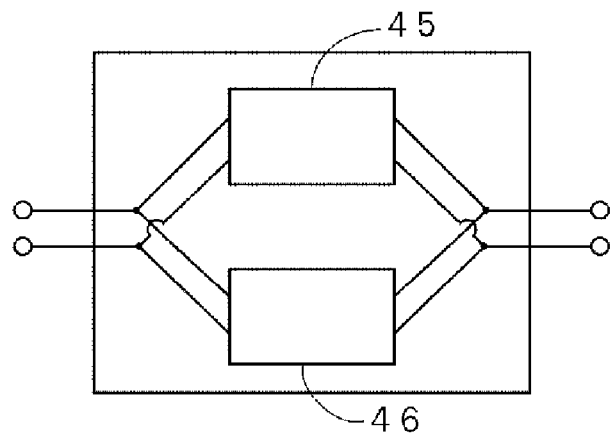
FIG. 43 is a circuit diagram for illustrating another example of a filter to which a preferred embodiment of the present invention is applied.
Figure 44:
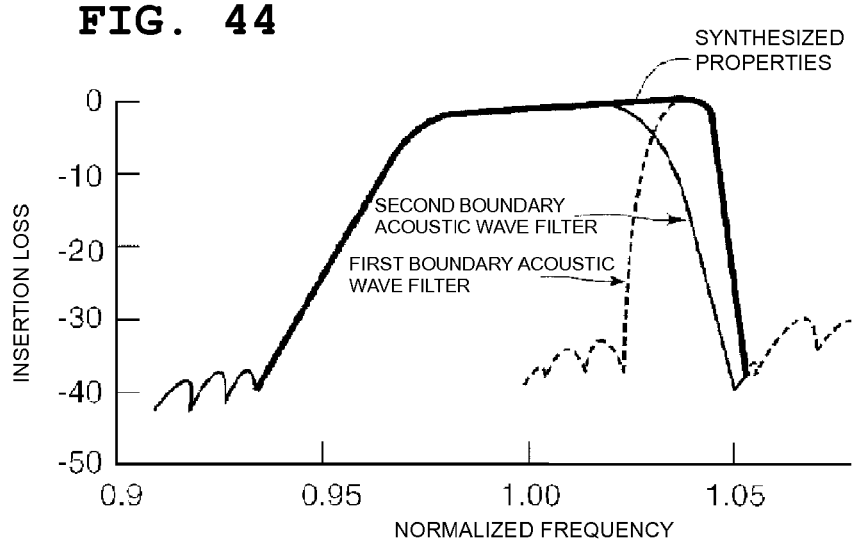
FIG. 44 is a graph for illustrating frequency characteristics of the filter shown in FIG. 43.
Figure 45:
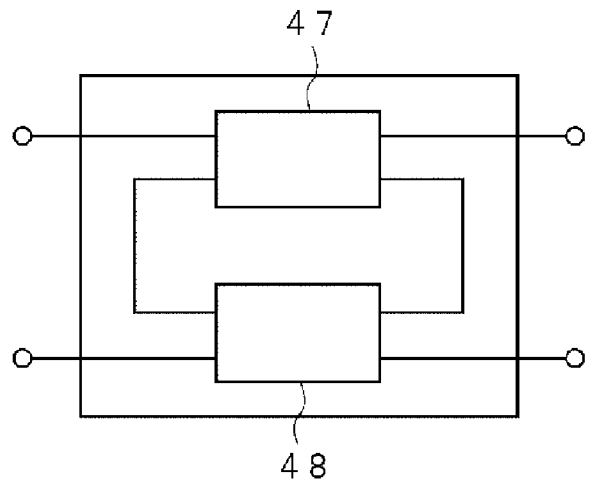
FIG. 45 is a circuit diagram for illustrating another example of a filter to which a preferred embodiment of the present invention is applied.

In addition, in the structure in which boundary acoustic wave filters are connected to each other in series or in parallel, when a high frequency side or a low frequency side of the pass band of one boundary acoustic wave filter and a low frequency side or a high frequency side of the pass band of another boundary acoustic wave filter are designed so as to be in contact with each other, a filter having a broad band can be provided. In this case, it is preferable that ends of the pass bands be in contact with each other at which the amount of attenuation is 3 dB. In the configuration thus designed, when boundary acoustic wave filters having different propagation directions are used in accordance with preferred embodiments of the present invention so that one boundary acoustic wave filter is used for a broad band and another boundary acoustic wave filter is used for a narrow band, the steepness can be increased at one of the high frequency side and the low frequency side of the pass band. That is, in the structure in which a first boundary acoustic wave filter 45 and a second boundary acoustic wave filter 46 are connected to each other in parallel as shown in FIG. 43, or in the structure in which a first boundary acoustic wave filter 47 and a second boundary acoustic wave filter 48 are connected to each other in series as shown in FIG. 45, when the pass band of the first boundary acoustic wave filter and that of the second boundary acoustic wave filter are very close to each other, synthesized band characteristics indicated by a thick solid line can be obtained as shown in FIG. 44. Even in the structure as described above, when the propagation direction is adjusted in accordance with preferred embodiments the present invention, broadband filter characteristics can be easily designed.

Furthermore, also in the structure in which a trap is formed for pass band characteristics by connecting a one-port type resonator in series or in parallel to one of an input terminal, a connection terminal, or an auxiliary connection terminal of a longitudinally coupled filter, when the propagation direction of the longitudinally coupled filter and that of the resonator are made different from each other, a trap band can be changed.

Furthermore, in a method for designing various boundary acoustic wave devices, when the technique is used in which the band width is adjusted by changing the electromechanical coefficient $k^2$ using the propagation direction, designing and manufacturing of boundary acoustic wave devices can be simplified. In addition, miniaturization can be advantageously achieved by one-chip integration.

Figure 46:
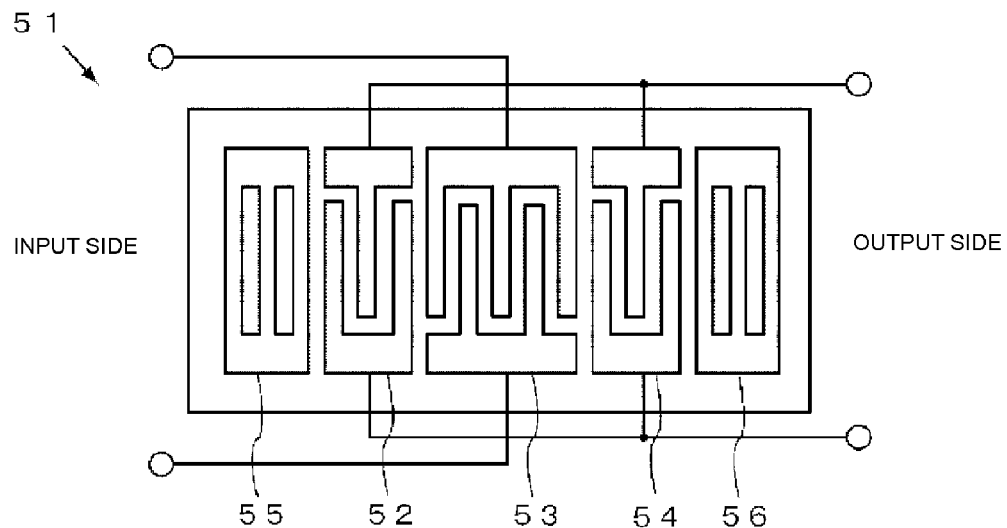
FIG. 46 is a plan view schematically showing an electrode structure of a longitudinally coupled filter provided in accordance with a preferred embodiment of the present invention.

In the boundary acoustic wave device according to preferred embodiments of the present invention, a longitudinally coupled filter may be provided. FIG. 46 is a schematic plan view only showing an electrode structure obtained when a longitudinally coupled filter is provided.

In FIG. 46, the electrode structure of a longitudinally coupled filter 51 is only shown by a schematic plan view. In practice, the electrode structure shown in FIG. 46 is formed at a boundary between a first layer and a second layer. That is, the front cross-sectional view of the longitudinally coupled filter 51 is approximately equivalent to that of the boundary acoustic wave device 1 shown in FIG. 1B, and the electrode structure is only modified as shown in FIG. 46.

As shown in FIG. 46, in the longitudinally coupled filter 51, three IDTs 52 to 54 are disposed along the propagation direction of a boundary acoustic wave. Reflectors 55 and 56 are disposed at two sides of a region in which the IDTs 52 to 54 are provided along the propagation direction of the boundary acoustic wave. The center IDT 53 is connected to input terminals, and ends of the IDT 52 and respective ends of the IDT 54 are connected to each other and are then connected to output terminals. That is, the longitudinally coupled filter 51 is a three-IDT type longitudinally coupled boundary acoustic wave filter.

As described above, the electrode structure including the IDTs 52 to 54 and the reflectors 55 and 56 is located at the boundary between the single crystal substrate and the solid layer.

Figure 47:
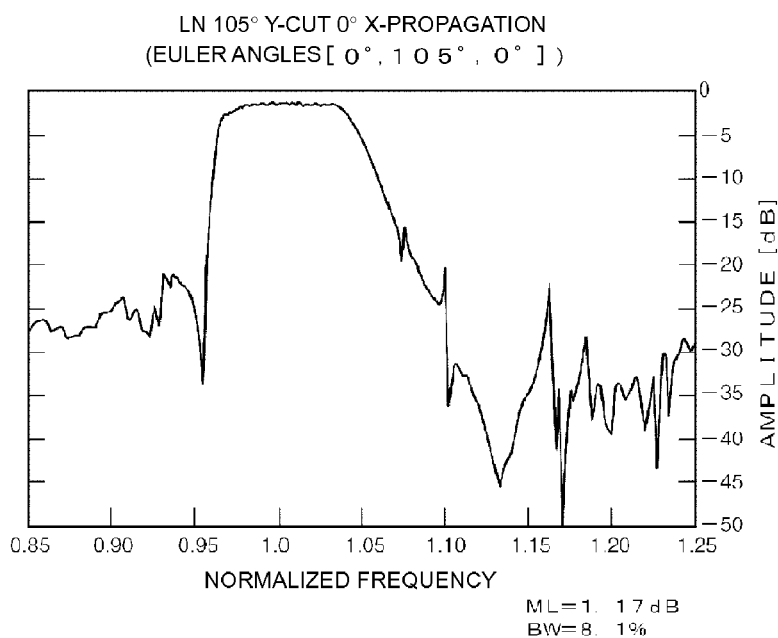
FIG. 47 is a graph showing one example of filter characteristics of the longitudinally coupled filter shown in FIG. 46.

As the above-described single crystal substrate, a 105° Y-cut 0° X-propagation LiNbO$_3$ substrate with Euler angles (0°, 105°, 0°) was used to form the longitudinally coupled filter 51 having the following specifications, and the frequency characteristics were measured. The results are shown in FIG. 47.

Electrode structure: after a NiCr film having a thickness of 0.03 λ, an Au film having a thickness of 0.05 λ, and a NiCr film having a thickness of 0.003 λ were laminated to each other in that order, the IDTs 52 to 54 and the reflectors 55 and 56 were formed from this laminated film. In addition, the solid layer covering the electrodes was formed from a SiO$_2$ film having a thickness of 2.0 λ.

The number of pairs of the electrode fingers of the IDTs 52 and 54 was 6, and the number of pairs of the electrode fingers of the IDT 53 was 10. The number of pairs of the electrode fingers of the reflectors 55 and 56 were each 40.

The period λ of the IDTs 52 to 54 was 3.0 μm, and the period of the reflectors 55 and 56 was 3.1 μm.

Next, a longitudinally coupled filter was formed in a manner equivalent to that described above except that the propagation angle of the single crystal substrate was changed by using a 105° Y-cut 20° X-propagation LiNbO$_3$ substrate with Euler angles (0°, 105°, 20°), and subsequently, the frequency characteristics were measured. The results are shown in FIG. 48.

Figure 48:
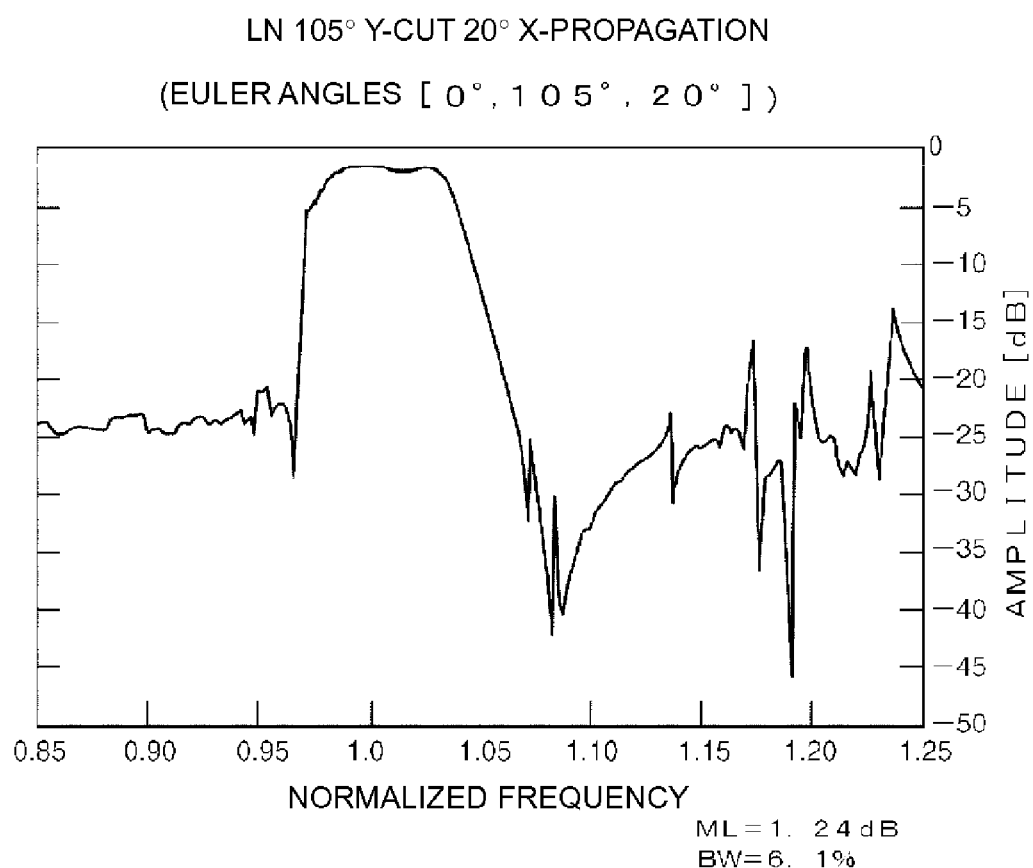
FIG. 48 is a graph showing another example of filter characteristics of the longitudinally coupled filter shown in FIG. 46.

As apparent by comparison between the results shown in FIGS. 47 and 48, it is understood that the pass band width is changed by changing the propagation angle. Hence, when a plurality of longitudinally coupled filters having different propagation angles is formed on the same substrate, a plurality of longitudinally coupled filters can be formed having different filter properties such as the pass band widths.

In addition, in the specification of the present invention, as the Euler angles (φ, θ, ψ) representing the cut surface of a substrate and the propagation direction of a boundary acoustic wave, the right-hand Euler angle system is used which has been disclosed in "Acoustic Wave Device Technology Handbook" (edited by Acoustic Wave Device Technology 150th Committee of the Japan Society for the Promotion of Science, first print/first edition issued on Nov. 30, 2001, p. 549). That is, with respect to crystal axes X, Y, and Z of LN, an Xa axis is obtained by φ rotation of the X axis about the Z axis in an anticlockwise direction. Next, a Z' axis is obtained by θ rotation of the Z axis about the Xa axis in an anticlockwise direction. A plane including the Xa axis and having the Z' axis as the normal line is set as the cut surface of a substrate. In addition, the direction of an X' axis obtained by ψ rotation of the Xa axis about the Z' axis in an anticlockwise direction is set as the propagation direction of a boundary acoustic wave.

In addition, as for the crystal axes X, Y, and Z of LiNbO$_3$ represented as the initial values of Euler angles, the Z axis is parallel to the c-axis, the X axis is parallel to any one of the three equivalent a-axes in three different directions, and the Y axis is parallel to the normal line of a plane including the X axis and the Z axis.

In addition, Euler angles equivalent to the Euler angles (φ, θ, ψ) of LiNbO$_3$ of preferred embodiments of the present invention in terms of crystallography may be used. For example, according to Journal of the Acoustical Society of Japan, Vol. 36, No. 3, 1980, pp. 140 to 145, since LiNbO$_3$ is a crystal belonging to the trigonal 3 m point group, the following equation A is satisfied.

$$F(\phi, \theta, \psi) = F(60° - \phi, -\theta, \psi) \quad \text{Equation A}$$
$$= F(60° + \phi, -\theta, 180° - \psi)$$
$$= F(\phi, 180° + \theta, 180° - \psi)$$
$$= F(\phi, \theta, 180° + \psi)$$

In the above equation, F is an optional boundary acoustic-wave property such as the electromechanical coefficient k$^2$, propagation loss, TCF, PFA, or a natural unidirectional property. As for PFA and natural unidirectional property, for example, when the propagation direction is reversed, although a plus or a minus sign indicating the direction is changed, the absolute value of the property is not changed, and hence it can be construed that they are practically equivalent to each other. In addition, although the above-described Journal of the Acoustical Society of Japan, Vol. 36, No. 3, 1980, pp. 140 to 145 relates to the surface acoustic wave, the symmetry of crystal may also be handled in the same manner with the boundary acoustic wave. For example, propagation properties of a boundary acoustic wave at Euler angles (30°, θ, ψ) are equivalent to those at Euler angles (90°, 180°−θ, 180°θ−ψ). In addition, for example, propagation properties of a boundary acoustic wave at Euler angles (30°, 90°, 45°) are equivalent to those at Euler angles shown in Table 8 below.

In addition, the material constant of the electrode used for calculation in preferred embodiments of the present invention is the value of a polycrystalline substance. However, even in a crystal substance such as an epitaxial film, since the crystal orientation dependence of a substrate dominantly influences the boundary acoustic wave properties as compared to that of the film itself, also in the case of the equivalent Euler angles represented by the equation A, equivalent boundary acoustic-wave propagation properties which may not cause any practical problems can be obtained.

TABLE 8

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |

TABLE 8-continued

| φ (°) | θ (°) | ψ (°) |
|---|---|---|
| 270 | 270 | 135 |
| 270 | 270 | 315 |
| 330 | 90 | 135 |
| 330 | 90 | 315 |
| 330 | 270 | 45 |
| 330 | 270 | 225 |

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A boundary acoustic wave device using a non-leaky propagation type boundary acoustic wave, comprising:
a plurality of boundary acoustic wave elements, each boundary acoustic wave element including a single crystal substrate, a solid layer provided on the single crystal substrate, and interdigital electrodes arranged at a boundary between the single crystal substrate and the solid layer; wherein
the single crystal substrates have a same cut angle;
a propagation direction of a boundary acoustic wave of at least one of the boundary acoustic wave elements is different from that of at least one of the other boundary acoustic wave elements;
a thickness of the solid layer is set such that energy of the boundary acoustic wave is not present on an outer surface of the single crystal substrate and is not present on an outer surface of the solid layer, the outer surface of the single crystal substrate and the outer surface of the solid layer are defined by respective surfaces of the single crystal substrate and the solid layer opposite to abutting surfaces of the single crystal substrate and the solid layer;
a thickness of the electrodes is set so that the acoustic velocity of an SH type boundary acoustic wave is lower than the acoustic velocity of a slow transverse wave propagating through the solid layer and the acoustic velocity of a slow transverse wave propagating through the piezoelectric single crystal substrate;
$H/\lambda > 8261.744\rho^{-1.376}$, when $\rho$ (kg/m$^3$) represents the density of the electrodes, H represents the thickness of the electrodes, and $\lambda$ represents the wavelength of a boundary wave which is defined by a placement period of electrode fingers of the interdigital electrodes; and
$\rho > 3,745$ kg/m$^3$.

2. The boundary acoustic wave device according to claim 1, wherein the plurality of boundary acoustic wave elements are boundary acoustic wave filters or boundary acoustic wave resonators.

3. The boundary acoustic wave device according to claim 1, wherein the plurality of boundary acoustic wave elements define resonators.

4. The boundary acoustic wave device according to claim 1, wherein the boundary acoustic wave device is a longitudinally coupled filter.

5. The boundary acoustic wave device according to claim 1, wherein the boundary acoustic wave elements are provided on a single piezoelectric single crystal substrate.

6. The boundary acoustic wave device according to claim 1, wherein an electromechanical coefficient of at least one of the boundary acoustic wave elements is different from that of at least one of the other boundary acoustic wave elements.

7. The boundary acoustic wave device according to claim 1, wherein a band width of at least one of the boundary acoustic wave elements is different from that of at least one of the other boundary acoustic wave elements.

8. The boundary acoustic wave device according to claim 1, wherein a duty ratio of the interdigital electrodes is set so that the acoustic velocity of an SH type boundary acoustic wave is lower than the acoustic velocity of a slow transverse wave propagating through the solid layer and the acoustic velocity of a slow transverse wave propagating through the piezoelectric single crystal substrate.

9. The boundary acoustic wave device according to claim 1, wherein $33,000.39050\rho^{-1.50232} < H/\lambda < 88,818.90913\rho^{-1.54998}$.

10. The boundary acoustic wave device according to claim 1, wherein the electrodes each include a main electrode layer made from a material selected from the group consisting of Au, Ag, Cu, Al, Fe, Ni, W, Ta, Pt, Mo, Cr, Ti, ZnO, and ITO.

11. The boundary acoustic wave device according to claim 10, wherein the electrodes each further include an additional electrode layer laminated on the main electrode layer.

12. The boundary acoustic wave device according to claim 11, wherein the solid layer includes a dielectric substance.

13. The boundary acoustic wave device according to claim 12, wherein the dielectric substance includes a material primarily composed of $SiO_2$.

14. The boundary acoustic wave device according to claim 12, wherein the solid layer includes a plurality of laminates, each of the plurality of laminates including a plurality of material layers.

15. The boundary acoustic wave device according to claim 14, wherein the solid layer includes a layer primarily composed of $SiO_2$ laminated to a layer primarily composed of Si.

16. The boundary acoustic wave device according to claim 12, wherein the solid layer includes at least one material selected from the group consisting of Si, $SiO_2$, glass, silicon nitride, silicon carbide, ZnO, $Ta_2O_5$, titanate zirconate lead piezoelectric ceramic, aluminum nitride, $Al_2O_3$, $LiTaO_3$, and $LiNbO_3$.

17. The boundary acoustic wave device according to claim 1, wherein the boundary acoustic wave elements each further includes a resin layer adhered to the solid layer.

18. A boundary acoustic wave device using a non-leaky propagation type boundary acoustic wave, comprising:
a plurality of boundary acoustic wave elements, each boundary acoustic wave element including a single crystal substrate, a solid layer provided on the single crystal substrate, and interdigital electrodes arranged at a boundary between the single crystal substrate and the solid layer; wherein
the single crystal substrates have a same cut angle;
a propagation direction of a boundary acoustic wave of at least one of the boundary acoustic wave elements is different from that of at least one of the other boundary acoustic wave elements;
a thickness of the solid layer is set such that energy of the boundary acoustic wave is not present wave is not present on an outer surface if the single crystal substrate and is not present on an outer surface of the solid layer, the outer surface of the single crystal substrate and the outer surface of the solid layer are defined by respective surfaces of the single crystal substrate and the solid layer opposite to abutting surfaces of the single crystal substrate and the solid layer;

a thickness of the electrodes is set so that the acoustic velocity of an SH type boundary acoustic wave is lower than the acoustic velocity of a slow transverse wave propagating through the solid layer and the acoustic velocity of a slow transverse wave propagating through the piezoelectric single crystal substrate; and the piezoelectric single crystal substrate is a $LiNbO_3$ substrate, $\phi$ of Euler angles ($\phi$, $\theta$, $\psi$) of the $LiNbO_3$ substrate is in the range of −31° to 31°, and $\theta$ and $\psi$ are in the range surrounded by points A1 to A13 shown in the following Table 1:

TABLE 1

| Points | $\psi$ (°) | $\theta$ (°) |
|--------|------------|--------------|
| A01 | 0 | 116 |
| A02 | 11 | 118 |
| A03 | 20 | 123 |
| A04 | 25 | 127 |
| A05 | 33 | 140 |
| A06 | 60 | 140 |
| A07 | 65 | 132 |
| A08 | 54 | 112 |
| A09 | 48 | 90 |
| A10 | 43 | 87 |
| A11 | 24 | 90 |
| A12 | 0 | 91 |
| A13 | 0 | 116. |

19. The boundary acoustic wave device according to claim 18, wherein the plurality of boundary acoustic wave elements are boundary acoustic wave filters or boundary acoustic wave resonators.

20. The boundary acoustic wave device according to claim 18, wherein the plurality of boundary acoustic wave elements define resonators.

21. The boundary acoustic wave device according to claim 18, wherein the boundary acoustic wave device is a longitudinally coupled filter.

22. The boundary acoustic wave device according to claim 18, wherein the boundary acoustic wave elements are provided on a single piezoelectric single crystal substrate.

23. The boundary acoustic wave device according to claim 18, wherein an electromechanical coefficient of at least one of the boundary acoustic wave elements is different from that of at least one of the other boundary acoustic wave elements.

24. The boundary acoustic wave device according to claim 18, wherein a band width of at least one of the boundary acoustic wave elements is different from that of at least one of the other boundary acoustic wave elements.

25. The boundary acoustic wave device according to claim 18, wherein a duty ratio of the electrodes is set so that the acoustic velocity of an SH type boundary acoustic wave is lower than the acoustic velocity of a slow transverse wave propagating through the solid layer and the acoustic velocity of a slow transverse wave propagating through the piezoelectric single crystal substrate.

26. The boundary acoustic wave device according to claim 18, wherein the electrodes each include a main electrode layer made from a material selected from the group consisting of Au, Ag, Cu, Al, Fe, Ni, W, Ta, Pt, Mo, Cr, Ti, ZnO, and ITO.

27. The boundary acoustic wave device according to claim 26, wherein the electrodes each further include an additional electrode layer laminated on the main electrode layer.

28. The boundary acoustic wave device according to claim 27, wherein the solid layer includes a dielectric substance.

29. The boundary acoustic wave device according to claim 28, wherein the dielectric substance includes a material primarily composed of $SiO_2$.

30. The boundary acoustic wave device according to claim 28, wherein the solid layer includes a plurality of laminates, each of the plurality of laminates including a plurality of material layers.

31. The boundary acoustic wave device according to claim 30, wherein the solid layer includes a layer primarily composed of $SiO_2$ laminated to a layer primarily composed of Si.

32. The boundary acoustic wave device according to claim 28, wherein the solid layer includes at least one material selected from the group consisting of Si, $SiO_2$, glass, silicon nitride, silicon carbide, ZnO, $Ta_2O_5$, titanate zirconate lead piezoelectric ceramic, aluminum nitride, $Al_2O_3$, $LiTaO_3$, and $LiNbO_3$.

33. The boundary acoustic wave device according to claim 18, wherein the boundary acoustic wave elements each further includes a resin layer adhered to the solid layer.

* * * * *